(12) United States Patent
Matsuoka et al.

(10) Patent No.: US 6,917,558 B2
(45) Date of Patent: Jul. 12, 2005

(54) CONTENT ADDRESSABLE MEMORY WITH REDUNDANT REPAIR FUNCTION

(75) Inventors: Hideto Matsuoka, Hyogo (JP); Hideyuki Noda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/768,036

(22) Filed: Feb. 2, 2004

(65) Prior Publication Data

US 2004/0174764 A1 Sep. 9, 2004

(30) Foreign Application Priority Data

Mar. 3, 2003 (JP) .......................................... 2003-056100
Sep. 5, 2003 (JP) .......................................... 2003-314052

(51) Int. Cl.[7] .............................. G11C 8/00; G11C 7/00
(52) U.S. Cl. ............................ 365/230.01; 365/230.08; 365/189.07
(58) Field of Search ........................ 365/230.01, 189.12, 365/230.08, 189.07, 203, 236

(56) References Cited

U.S. PATENT DOCUMENTS 6,034,891 A * 3/2000 Norman .................. 365/185.09
6,042,241 A * 3/2000 Lengyel ........................ 362/84
6,441,811 B1 * 8/2002 Sawada et al. ............. 345/204

* cited by examiner

*Primary Examiner*—Thong Q. Le
(74) *Attorney, Agent, or Firm*—McDermott Will & Emery LLP

(57) ABSTRACT

A shift information latch circuit includes a plurality of latch portions provided corresponding to memory cell rows, respectively, and a fuse circuit transmitting fuse data produced corresponding to an address of a faulty memory cell row. The plurality of latch portion successively receive fuse data, and each transmit a shift control signal instructing a shift operation. In response to this shift control signal, a row decoder and a match line amplifier execute a shift operation for repairing the faulty memory cell row. In this structure, a decoder circuit decoding the address of the faulty memory cell row is not arranged so that a whole area of the circuits executing the shift operation is reduced, and the shift operation can be easily executed.

10 Claims, 20 Drawing Sheets

CONTENT ADDRESSABLE MEMORY WITH REDUNDANT REPAIR FUNCTION

BACKGROUND OF THE INVENTION

1. Field of the Invention

The present invention relates to a content addressable memory, and particularly to a content addressable memory having a redundant repair function of repairing a faulty memory cell row with a spare redundant memory cell row.

2. Description of the Background Art

As one of major applications of memory devices, there is a CAM (Content Addressable Memory), which receives an input data and compares it with storage data (retrieval data) forming retrieval information to determine matching or mismatching between them. This kind of CAM is used, e.g., in a data processing system for address comparison in an operation of determining cache hit/mishit, which is performed during cache access for determining whether required data is stored or not.

On the other hand, ordinary memory devices such as SRAMs (Static Random Access Memories) or DRAMs (Dynamic Random Access Memories) are provided with spare redundant memory cell rows as redundant circuits. When there is a faulty memory cell row, it is replaced with a spare redundant memory cell row to repair the faulty memory cell row. Thereby, manufacturing yield of memory devices can be improved, and such redundant circuit technology has been generally used.

However, the CAM has memory cell rows, which are significantly different in structure from those of the ordinary memory device. For repairing a memory cell row in the CAM, the repairing must be performed not only in address selection (decoding), which is executed when reading and writing data, but also in a function (encoding) of successively providing matched addresses in accordance with a priority after a data retrieving operation.

Due to the function and the circuit structure peculiar to the CAM, the faulty memory cell row cannot be repaired without difficulty.

However, Japanese Patent Laying-Open No. 2002-260389 has disclosed a structure, which mutually converts logical addresses (externally applied addresses) and physical addresses (addresses to be used actually and internally) for executing the redundant repair of the memory cell row. More specifically, a shift operation of shifting a memory cell row, which corresponds to an address higher (or lower) than a faulty memory cell row, is executed based on a faulty address of the faulty memory cell row and a logical address. Thereby, the redundant repair of the faulty memory cell row is executed with the redundant memory cell row according to the structure disclosed in the above publication.

In the above publication, however, the faulty address is once predecoded, and then the shift operation is executed based on a result of this predecoding and a result of decoding of input of the ordinary logical address. Therefore, it is necessary to arrange a decode circuit of a relatively large circuit scale.

Accordingly, it is necessary to ensure a sufficiently large layout area for the decode circuit, resulting in a problem that the memory device requires a large circuit area.

In the above publication, the result of predecoding of the faulty address by the predecode circuit is used for executing the shift operation. More specifically, for comparing this result of the predecoding with the result of decoding of the logical address, the result of the predecoding is transmitted for every memory cell row. This increases the number of signal lines transmitting the predecode signals from the predecode circuit to the respective memory cell rows. Due to the increase in number of the signal lines, therefore, it is necessary for circuit design to give sufficient consideration to restrictions on lines and interconnections. This results in a problem that the circuit design is complicated. In particular, the number of interconnections for the predecode signals further increase in accordance with the bit length of the address. Therefore, the above problem becomes particularly remarkable when an array of a large capacity is to be constructed.

SUMMARY OF THE INVENTION

The invention has been developed for overcoming the above problems, and it is an object of the invention to provide a content addressable memory, which requires only a small circuit area and a simple structure, and can execute redundant repair of a memory cell row.

According to the invention, a content addressable memory for making a comparison between input information and retrieval information includes a memory array, first and second shift circuits, an address producing circuit, a plurality of latch circuits, and a shift instructing signal producing portion. The memory array includes a plurality of memory cell rows storing the retrieval information, and a redundant memory cell row repairing a faulty memory cell row. The first shift circuit shifts, if necessary, each of at least one memory cell row to be accessed in a first direction when data reading and data writing. The second shift circuit shifts each of the at least one of memory cell row shifted in the first direction by the first shift circuit in a second direction opposite to the first direction in data retrieving. The address producing circuit produces an intended address based on information transmitted from each of the memory cell rows through the second shift circuit in the data retrieving operation. The plurality of stages of latch circuits are provided corresponding to respective addresses of the plurality of memory cell rows and each latch a shift instructing signal instructing an operation of shifting the corresponding memory cell row in the first and second shift circuits. The shift signal producing portion produces the shift signal to be latched by each of the latch circuits based on a faulty address of the faulty memory cell row.

According to the invention, as described above, the content addressable memory is provided with the plurality of latch circuits latching the shift instructing signal, which is produced based on the faulty address to instruct the shift operation. Thereby, it is not necessary in an access operation to decode the address of the faulty memory cell row by a decoder circuit, and thus a shift operation based on a result of such decoding is not required. Therefore, the number of signal lines and an area of a whole circuit can be reduced, and the shift operation can be executed simply and easily.

Also, according to the invention, a content addressable memory for making a comparison between input information and retrieval information includes a memory array, first and second shift circuits, an address producing circuit, a plurality of latch circuits, and a shift instructing signal producing portion. The memory array includes a plurality of memory cell rows storing the retrieval information, and a plurality of redundant memory cell rows repairing a faulty memory cell row. The plurality of memory cell rows are divided into a plurality of memory cell row groups, each group including a predetermined number of the memory cell rows, corresponding to a part of bits of addresses the plurality of memory cell rows. The first shift circuit shifts, if necessary, each of at least one memory cell row group to be accessed in a first direction when data reading and data writing. The second shift circuit shifts each of the at least one of memory cell row shifted in the first direction by the first shift circuit in a second direction opposite to the first direction in data retrieving. The address producing circuit produces an intended address based on information transmitted from each of the memory cell row groups through the second shift circuit in the data retrieving operation. The plurality of stages of latch circuits are provided corresponding to the plurality of memory cell row groups, respectively, and each latch a shift instructing signal instructing an operation of shifting the corresponding memory cell row group in the first and second shift circuits. The shift signal producing portion produces the shift signal to be latched by each of the latch circuits based on a faulty address of the faulty memory cell row.

The content addressable memory is provided with the plurality of latch circuits latching the shift instructing signal, which is produced based on the faulty address to instruct the shift operation, so that the memory cell row groups can be shifted a predetermined number at a time based on the shift signal latched by the latch circuit. By shifting the plurality of memory cell row groups at a time, the number of parts and lines of circuits used in the shift operation can be reduced, as compared in the case of executing an independent shift operation for each memory cell row.

Further, a content addressable memory for comparing input information with retrieval information includes a memory array, first and second shift circuits, an address producing circuit, and a control circuit. The memory array includes a plurality of memory cell rows storing the retrieval information, and a redundant memory cell row repairing a faulty memory cell row. The first shift circuit shifts, if necessary, each of at least one memory cell row to be accessed in a first direction when data reading and data writing. The second shift circuit shifts each of at least one of the memory cell row shifted in the first direction by the first shift circuit in a second direction opposite to the first direction in data retrieving. The address producing circuit produces an intended address based on information transmitted from each of the memory cell rows through the second shift circuit in the data retrieving. The control circuit controls the first and second shift circuits based on a faulty address of the faulty memory cell row. The memory array further includes match lines provided corresponding to the memory cell rows including the redundant memory cell row, respectively, for determining whether the input information matches with a portion of the retrieval information stored in the respective memory cell rows. Each of the memory cell rows including the redundant memory cell row has a plurality of memory cells each storing one bit of storage data. Each of the memory cells includes first and second cell units and a comparing circuit. The first cell unit has a first storage node holding first data. The second cell unit has a second storage node holding second data. The comparing circuit compares a pair of data held on the first and second storage nodes with input data forming the applied input information, and selectively drives the corresponding match line in accordance with a result of the comparison.

The content addressable memory further includes a control circuit controlling shift operations of the first and second shift circuits based on the faulty address. The memory cell forming the memory array includes first and second cell units having first and second storage nodes, respectively, and a comparing circuit comparing the retrieval data stored on the first and second storage nodes with the input data. According to this structure, redundant repair for repairing the faulty memory cell row can be easily executed in so called TCAM memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers or characters, and description thereof is not repeated.

First Embodiment

Figure 1:
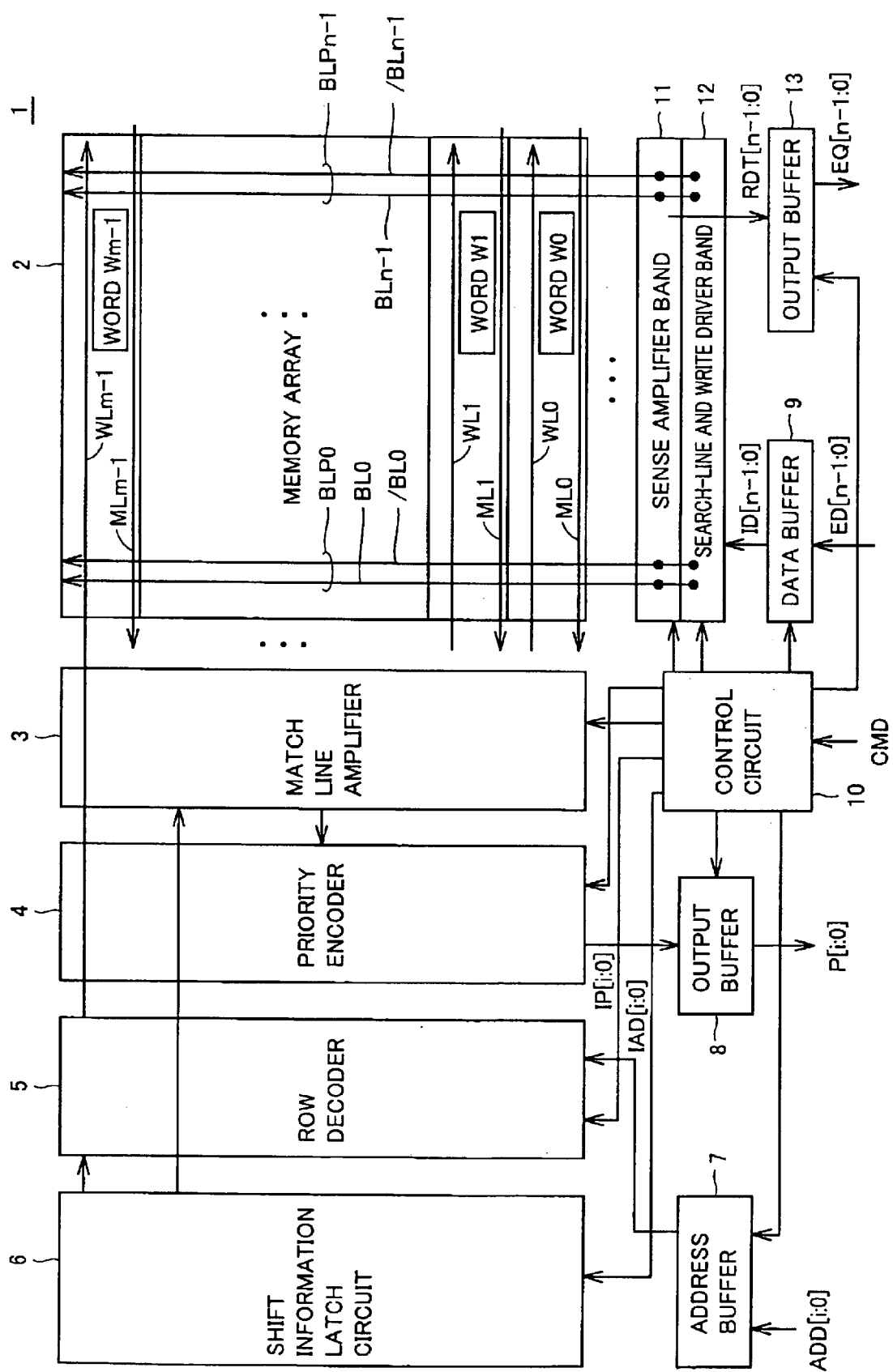
FIG. 1 shows a whole structure of a CAM according to an embodiment of the invention.

Referring to FIG. 1, a CAM 1 according to a first embodiment of the invention includes a memory array 2 having CAM cells, which are integrated and arranged in rows and columns for storing retrieval information to be used for a comparing or match-determining operation, a match line amplifier 3, priority encoder 4, a row decoder 5, a shift information latch circuit 6, an address buffer 7, output buffers 8 and 13, a data buffer 9, a control circuit 10, a sense amplifier band 11 and a search line write drivers band 12.

Memory array 2 includes a plurality of word lines WL0–WLm−1, which are arranged corresponding to the memory cell rows, respectively, and may be generally referred to as "word lines WL" hereinafter, a plurality of match lines ML0–MLm−1, which may be generally referred to as "match lines ML" hereinafter, and bit line pairs BLP0–BLn−1, which are arranged corresponding to the memory cell columns, respectively, and may be generally referred to as "bit line pairs BLP" hereinafter. In this embodiment, memory array 2 includes, e.g., m row and n columns. Bit line pair BLP includes a bit line BL and a complementary bit line /BL. FIG. 1 representatively shows a bit line BL0 and a complementary bit line /BL0 forming a bit line pair BLP0 as well as a bit line BLn−1 and a complementary bit line /BLn−1 forming a bit line pair BLPn−1.

Memory array 2 has memory cell rows of m in number as shown in FIG. 1, and words W0–Wm−1 designated by continuous addresses are stored in the respective memory cell rows. This embodiment employs, e.g., word Wm−1 as a redundant memory cell row repairing a faulty memory cell row. This embodiment is configured, for example, such that word W0 corresponds to the lowest address, and word Wm−1 corresponds to the highest address.

A row decoder 5 decodes an internal address IAD[i:0] in response to an instruction provided from control circuit 10, and accesses at least one of the plurality of word lines WL0–WLm−1. Also, row decoder 5 executes a shift operation of shifting the memory cell row, which is to be accessed physically in an access operation, based on shift information provided from shift information latch circuit 6. Internal address(es) IAD[i:0] described above generally represents address(es) IAD<0>–IAD<i>. In the following description, a signal(s) Z[i:0] represents signal(s) Z<0>–Z<i>.

Shift information latch circuit 6 is activated in response to an instruction provided from control circuit 10, and thereby provides internally produced shift information to row decoder 5 and match line amplifier 3. Address buffer 7 buffers an external address (logical address) ADD[i:0] applied thereto in response to an instruction provided from control circuit 10, and thereby produces internal address IAD[i:0]. Control circuit 10 controls a whole operation of CAM 1 based on an externally applied command CMD applied thereto.

In a data read operation, sense amplifier band 11 responds to an instruction provided from control circuit 10, and operates to receive and amplify a data signal transmitted from bit line pair BLP corresponding to the selected column, and to provide it as read data RDT[n−1:0] to an output buffer 13. In this example, it is assumed that bit line pairs BLP0–BLPn−1 are selected in parallel to provide read data RDT[n−1:0] of n bits in a data read operation. Output buffer 13 responds to an instruction provided from control circuit 10, and operates to buffer read data RDT[n−1:0] sent from sense amplifier band 11 and to provide it externally as data EQ[n−1:0].

Data buffer 9 responds to an instruction provided from control circuit 10, and operates to buffer externally applied input data ED[n−1:0] for providing it as internal input data ID[n−1:0] (which may be generally referred to as "internal input data ID" hereinafter) to search-line and write driver band 12.

Search-line write drivers band 12 transmits signals at predetermined logical levels to respective bit line pairs BLP in accordance with internal input data ID, which is applied at the time of data retrieving or data writing. In this example, the data writing is performed in parallel on the respective memory cells forming the memory cell row corresponding to selected word W. In the data retrieving operation, the comparing operation is performed on all words W (all memory cell rows) stored in the memory array.

In the data retrieving operation, match line amplifier 3 responds to the instruction provided from control circuit 10, and operates to amplify the match signals transmitted to respective match lines ML0–MLm−1 for outputting them to priority encoder 4. In this output operation, match line amplifier 3 executes the shift operation based on the shift information provided from shift information latch circuit 6, and particularly executes the shift operation for transmitting the match signal, which is provided from the memory cell row physically shifted based on the shift operation in row decoder 5, as the match signal of the memory cell row corresponding to the original logical address.

Priority encoder 4 produces the matched highest address IP[i:0] based on the match signal transmitted from match line amplifier 3 in response to the instruction provided from control circuit 10.

Output buffer 8 responds to an instruction provided from control circuit 10, and buffers address IP[i:0] produced from priority encoder 4 for outputting it as address P[i:0].

Figure 2:
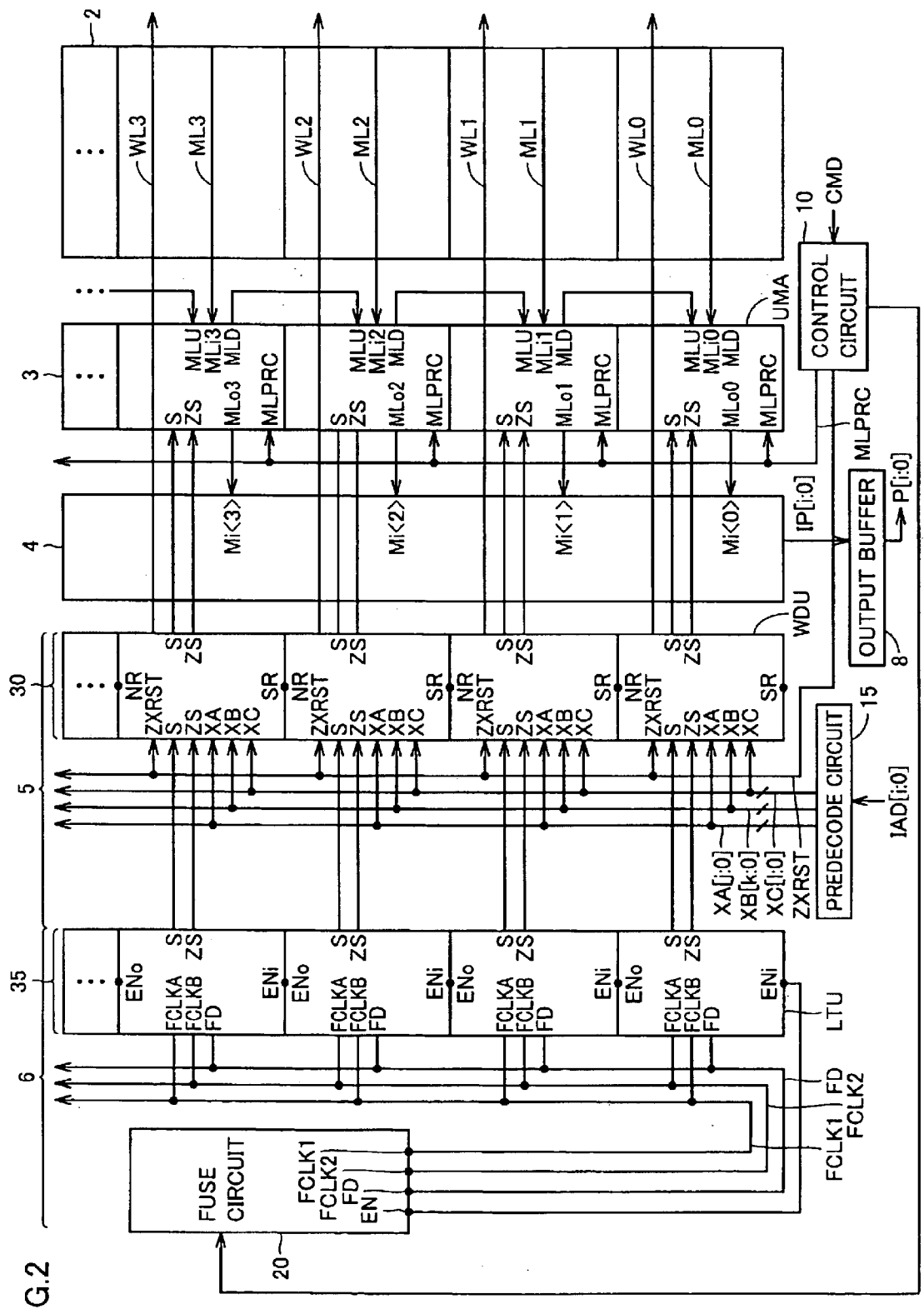
FIG. 2 is a block diagram showing more specifically the CAM according to the first embodiment of the invention.

Referring to FIG. 2, shift information latch circuit 6 according to the first embodiment of the invention includes a fuse circuit 20 providing control signals EN and FD, which are produced based on a prestored faulty address, as well as clock signals FCLK1 and FCLK2, and a latch group 35 latching a shift control signal forming the shift information based on the control signals provided from fuse circuit 20. Latch group 35 includes a plurality of latch portions LTU, which are arranged corresponding to the plurality of memory cell rows, respectively, and are connected together in series. Latch portions LTU connected in series successively latch various control signals EN and FD, which are transmitted from fuse circuit 20, one by one in synchronization with clock signals FCLK1 and FCLK2, and thereby set shift control signals. More specifically, a shift control signal S and its inverted signal ZS are set to latch portion LTU, starting from latch portion LTU corresponding to the memory cell row at a lower address to latch portion LTU corresponding to the memory cell row at a higher address, and provides signals S and ZS thus set to row decoder 5 and match line amplifier 3.

Row decoder 5 includes a predecode circuit 15 and a word line select circuit 30. Predecode circuit 15 decodes received internal address IAD[i:0] to produce predecode signals XA[i:0], XB[i:0] and XC[i:0]. Predecode signals XA[i:0], XB[i:0] and XC[i:0] may be generally referred to as "predecode signals XA, XB and XC" hereinafter.

Word line select circuit 30 includes a plurality of word line select units WDU provided corresponding to the memory cell rows, respectively. Each word line select unit WDU receives shift control signals S and ZS from latch portion LTU corresponding to the same memory cell row. Word line select unit WDU executes the access (select operation) to corresponding word line WL based on predecode signals XA, XB and XC provided from predecode circuit 15, and also executes the shift operation of shifting the select operation for corresponding word line WL based on shift control signals S and ZS provided from corresponding latch portion LTU in shift information latch circuit 6.

More specifically, it receives on its input node SR the select signal for selecting the word line from word line select unit WDU in the preceding stage or position. Also, it transmits from an output node NR a select signal for selecting the word line to input node SR corresponding to word line select unit WDU in the next stage based on shift control signals S and ZS. Further, word line select unit WDU stops the access (select operation) to word line WL based on the input of a control signal ZXRST provided from control circuit 10.

Match line amplifier 3 includes a plurality of match amplifier units UMA provided corresponding to the memory cell rows, respectively. Each match amplifier unit UMA receives shift control information S and ZS from latch portion LTU provided corresponding to the same memory cell row. Match amplifier unit UMA amplifies the match signal transmitted from corresponding match line ML, and shifts the transmission of the match signal, which is transmitted to corresponding match line ML, based on shift control signals S and ZS, when necessary.

More specifically, match amplifier unit UMA receives on its input node MLU the match signal transmitted from match amplifier unit UMA at a higher address (in a higher stage in this example) based on shift control signals S and ZS. Further, it provides from its output node the match signal to match amplifier unit UMA corresponding to the lower address (lower stage in this example) based on shift control signals S and ZS. Match amplifier unit UMA provides from its corresponding output node MLo the match signal to priority encoder 4 by performing the shift operation based on shift control signals S and ZS. Match amplifier unit UMA precharges corresponding match line ML to a predetermined voltage level ("H" level) in response to the input of a control signal MLPRC transmitted from control circuit 10.

FIG. 2 representatively shows four match amplifier units UMA successively corresponding to lower addresses. Four match amplifier units UMA receive on input nodes MLi0–MLi3 the match signal from match lines ML0–ML3, respectively. Also, four match amplifier units UMA provide match signals Mi<0>–Mi<3> from output nodes MLo0–MLo3 to priority encoder 4, respectively. Input nodes MLi and output nodes MLo generally represent input nodes MLi0–MLi3 and output nodes MLo0–MLo3.

Priority encoder 4 receives match signals Mi transmitted from the plurality of match amplifier units UMA of match line amplifier 3, and produces, as address IP[i:0], the address of the memory cell row corresponding to the highest address. Output buffer 8 buffers address IP[i:0] to provide an address P[i:0] as already described. Specific operations and structures of the respective circuits will be described later in detail. Description has been given on latch portions LTU, word line select units WDU and match amplifier units UMA provided corresponding to the memory cell rows. However, the redundant memory cell row is provided for the purpose of repairing a faulty memory cell. Therefore, latch portion LTU, word line select unit WDU and match amplifier unit UMA corresponding to the redundant memory cell row may be eliminated.

The embodiment of the invention is aimed at the redundant repair structure repairing the faulty memory cell row. However, prior to description of the redundant repair structure, the comparing or match-determining operation in CAM 1 will now be described.

Figure 3:
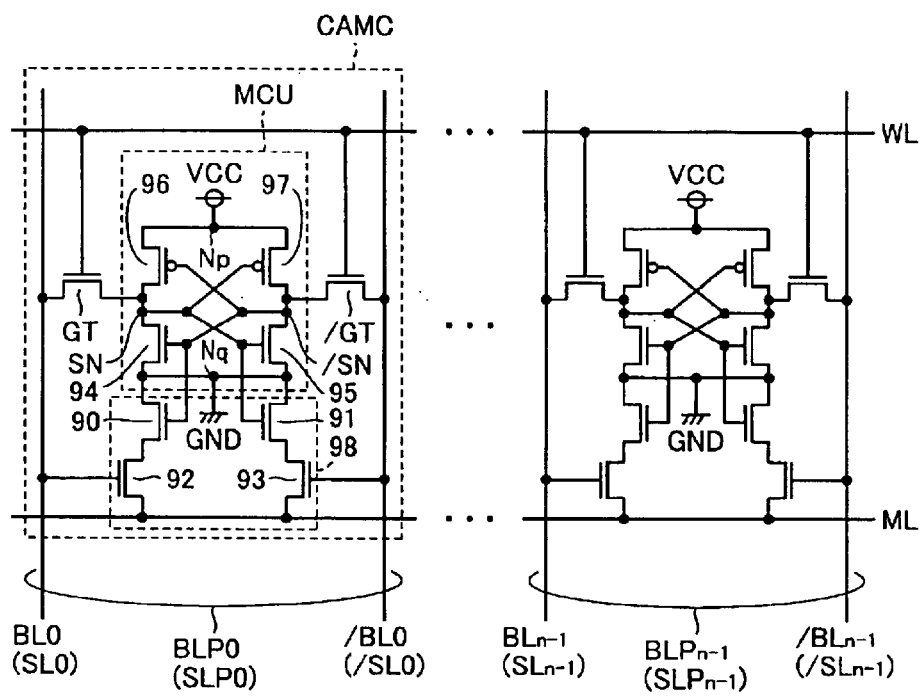
FIG. 3 shows circuit structures of CAM memory cells integrated in a memory array according to the first embodiment of the invention.

Referring to FIG. 3, which shows circuit structures of CAM memory cells CAMC (which may be simply referred to as "memory cells CAMC" hereinafter) arranged in memory array 2 according to the first embodiment of the invention, two memory cells CAMC are provided corresponding to bit line pairs BLP0 and BLPn−1, respectively. Since all the memory cells CAMC have the same structure, the following description will be given on the structure of memory cell CAMC corresponding to bit line pair BLP0.

Memory cell CAMC includes a memory cell unit MCU, gate transistors GT and /GT, and a comparing portion 98.

Memory cell unit MCU includes transistors 94–97. For example, transistors 94 and 95 are N-channel MOS transistors, respectively. Transistors 96 and 97 are P-channel MOS transistors, respectively. Transistor 96 is arranged between a node Np receiving a power supply voltage VCC and a sense node SN, and has a gate electrically coupled to sense node /SN. Transistor 97 is arranged between node Np receiving power supply voltage VCC and sense node /SN, and has a gate electrically coupled to sense node SN. Transistor 94 is arranged between sense node SN and a node Nq receiving a ground voltage GND, and has a gate electrically coupled to sense node /SN. Transistor 95 is arranged between sense node /SN and node Nq receiving a ground voltage GND, and has a gate electrically coupled to sense node SN. Memory cell unit MCU formed of transistors 94–96 is an SRAM cell of a so-called cross-couple type, and holds storage data by setting one and the other of sense nodes SN and /SN to the "H" and "L" levels, respectively.

In this example, the storage data is "0" when sense nodes SN and /SN are set to the "H" and "L" levels, respectively. Also, the storage data is "1" when sense nodes SN and /SN are set to the "L" and "H" levels, respectively. The relationships of storage data of "0" and "1" to the levels may be inverted.

Gate transistor GT is arranged between bit lines BL0 and sense node SN, and has a gate electrically coupled to corresponding word line WL. Gate transistor /GT is arranged between sense node /SN and bit line /BL0, and has a gate electrically coupled to corresponding word line WL.

Comparing portion 98 performs the comparing operation of determining whether the storage data stored in memory cell unit MCU matches with the input data or not. Comparing portion 98 includes transistors 90–93 formed of, e.g., N-channel MOS transistors, respectively.

Transistors 90 and 92 are connected in series between node Nq receiving ground voltage GND and corresponding match line ML, and have gates electrically coupled to sense node SN and bit line BL0, respectively. Transistors 91 and 93 are connected in series between node Nq receiving ground voltage GND and corresponding match line ML, and have gates electrically coupled to sense node /SN and bit line /BL0. As described above, memory cell unit MCU is equivalent to an SRAM cell of a so-called cross-couple type, and operations for reading and writing data will not be described in greater detail. This SRAM cell functions as a flip-flop circuit, of which two sense nodes are set to different voltage levels in accordance with the data to be stored, respectively.

Bit line pair BLP provided corresponding to memory cell CAMC functions as a search line pair SLP during a data retrieving operation. Search line pair SLP has a search line SL and a complementary search line /SL, which correspond to bit lines BL and /BL, respectively.

Figure 4:
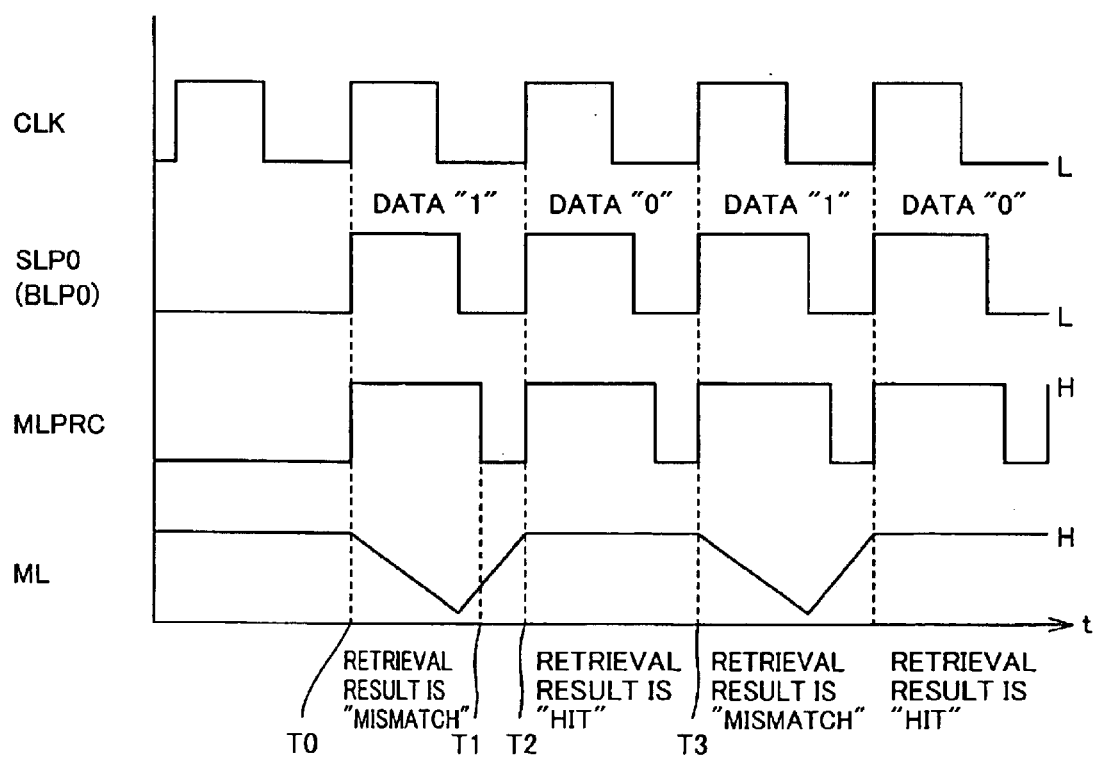
FIG. 4 is a timing chart illustrating a data retrieving operation in the memory cell corresponding to a bit line pair.

Referring to a timing chart of FIG. 4, description will now be given on the data retrieving operation of memory cell CAMC corresponding to bit line pair BLP0 already described with reference to FIG. 3. It is assumed that internal circuits operate in synchronization with clock signal CLK, and memory cell CAMC stores storage data of "0". For the same of simplicity, one bit of internal input data ID is provided according to the following description.

At a time T0 synchronized with the rising of the clock signal, data corresponding to internal input data ID ("1") is transmitted to search line pair SLP0 (bit line pair BLP0). More specifically, search line SL0 (bit line BL0) and complementary search line /SL0 (bit line /BL0) are set to the "H" and "L" levels, respectively. In response to this, transistor 92 is turned on in comparing portion 98 of memory cell CAMC. Since memory cell CAMC has stored storage data of "0", sense nodes SN and /SN are set to the "L" and "H" levels, respectively. In comparing portion 98, therefore, transistor 90 is turned on in response to the voltage level on sense node /SN. Thereby, transistors 90 and 92 connected in series are both turned on so that match line ML is electrically connected to node Nq supplied with ground voltage GND. Therefore, the voltage level on match line ML is pulled down by ground voltage GND from a predetermined voltage level (i.e., "H" level), which was precharged. In this case, therefore, it is determined that the storage data in memory cell CAMC does not match with the input data, and the result of retrieval is determined as a mismatch or error.

At a time T1 after the retrieval result is obtained, control signal MLPRC is set to the "L" level. Thereby, match line ML is precharged to a predetermined voltage level ("H" level). Thereby, a preparing operation for the next data retrieving operation is completed.

At a subsequent time T2 synchronized with the rising of the clock signal, data corresponding to internal input data ID ("0") is transmitted to search line pair SLP0. More specifically, search line SL0 and complementary search line /SL0 are set to the "L" and "H" levels, respectively. In response to this, transistor 93 is turned on in comparing portion 98. In memory cell CAMC, since storage data of "0" is stored as already described, transistor 90 is on in comparing portion 98. In comparing portion 98, therefore, match line ML is not electrically coupled to node Nq supplied with ground voltage GND. Thereby, match line ML maintains the predetermined voltage level of "H". In this case, therefore, it is determined that the storage data in memory cell CAMC matches with the input data, and the retrieval result is determined as "hit". In synchronization with the next rising of clock signal CLK, a similar data retrieving operation is executed in accordance with the input of internal input data at and after a time T3.

In practice, the above operations are not performed only in a single memory cell. Similar operations are performed in parallel in the respective memory cells forming the memory cell row, and the voltage levels on match lines ML are set. More specifically, if comparing portions 98 of all memory cells CAMC forming the memory cell row do not electrically couple corresponding match line ML to ground voltage GND, corresponding match line ML maintains the predetermined voltage level of "H". Thus, it can be determined that the applied internal input data ID[n−1:0] matches with the storage data stored in each memory cell CAMC in the predetermined memory cell row.

Even when at least one of comparing portions 98 of memory cells CAMC forming the memory cell row electrically couples corresponding match line ML to ground voltage GND, corresponding match line ML is set to the voltage level of ground voltage GND (i.e., "L" level). Thus, it is determined that applied internal input data ID[n−1:0] do not match with the storage data stored in each memory cell CAMC in the predetermined memory cell row. In the respective memory cell rows, this operation is performed in parallel so that the voltage levels set on respective match lines ML0–MLm−1 are provided as the match signal to priority encoder 4 through match line amplifier 3.

Figure 5:
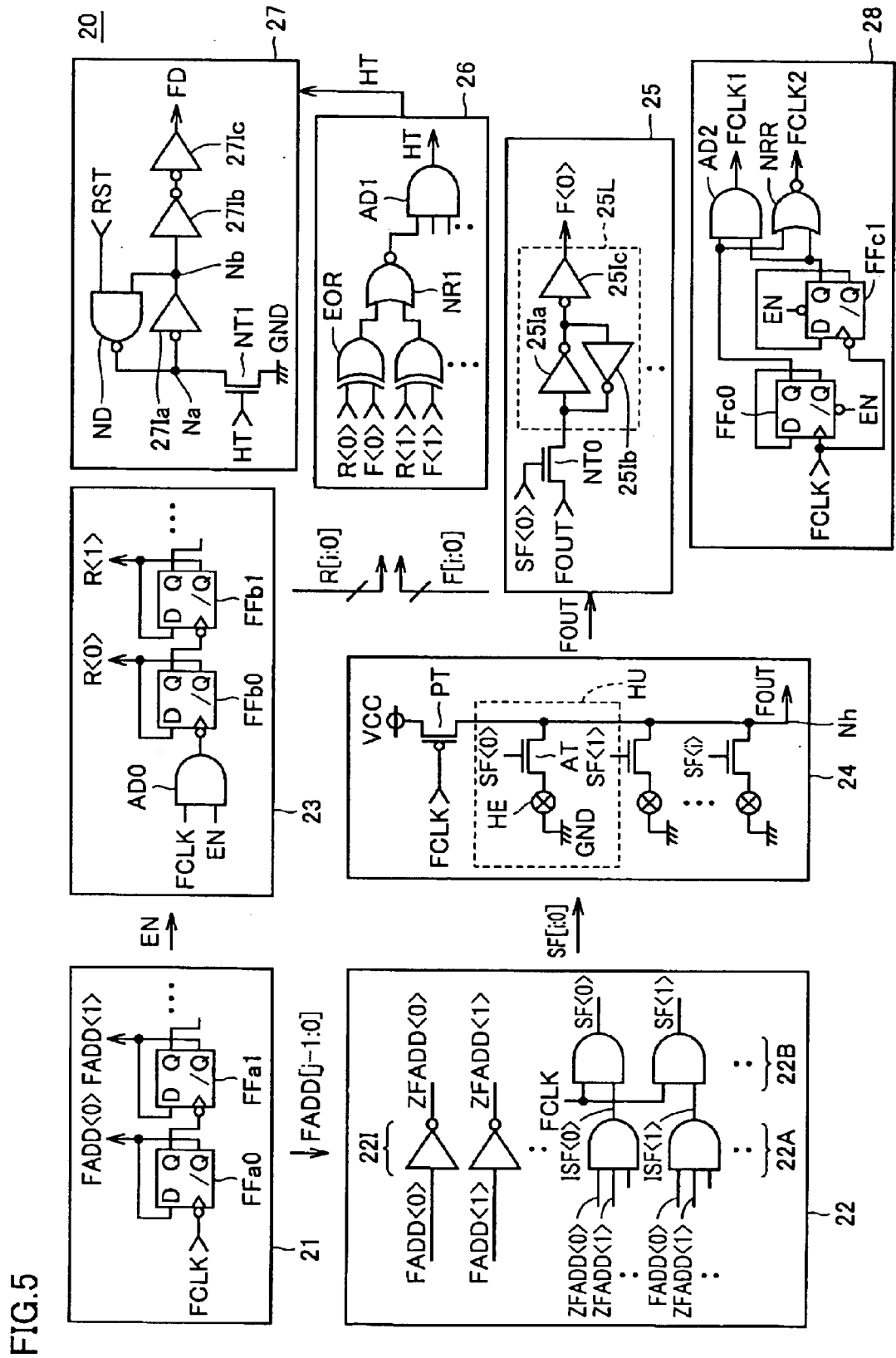
FIG. 5 is a schematic block diagram showing a circuit group arranged in a fuse circuit according to the first embodiment of the invention.

Referring to FIG. 5, fuse circuit 20 according to the first embodiment of the invention includes a two-phase clock generating circuit 28, counter circuits 21 and 23, a decoder circuit 22, a fuse group 24, a fuse register 25, an address comparing circuit 26 and a fuse data generating circuit 27.

Counter circuit 21 has a plurality of flip-flop circuits FFa0, FFa1, address FADD[j−1:0] in synchronization with the input of clock signal FCLK to increment an address value one by one. Although not shown, counter circuit 21 includes a circuit producing control signal EN based on setting of a predetermined count value. The predetermined count value is equal to a counted address value, which is incremented over times corresponding to a bit length of the faulty address. More specifically, the faulty address has a bit length of (i+1) bits, and the predetermined count value is equal to a value obtained when counter circuit 21 counts over (i+1) times.

Decoder circuit 22 includes an inverter group 22I, which inverts each counter address FADD[j−1:0] applied thereto, and provides a counter address ZFADD[j−1:0], and AND circuit groups 22A and 22B performing decoding processing.

AND circuit group 22A includes a plurality of AND circuits arranged in parallel. AND circuit group 22A produces internal decode signals ISF[i:0], which are output signals of the respective AND circuits, in accordance with a combination of predetermined counter addresses. More specifically, each of internal decode signals ISF<0>–ISF<i> is successively activated to attain the "H" level in synchronization with the counting of counter circuit 21. AND circuit group 22B includes a plurality of AND circuits arranged in parallel. The plurality of AND circuits forming AND circuit group 22B receive clock signal FCLK and internal decode signals ISF<0>–ISF<i> on their inputs, and produce decode signals SF[i:0], which may be generally referred to as "decode signals SF" hereinafter. Thus, decode signals SF[i:0] are issued in accordance with the timing synchronized with the rising of clock signal FCLK.

In response to, e.g., the counting of counter address FADD by counter circuit 21, therefore, decode signals SF<0>–SF<i> are set in ascending order to the "H" level in synchronization with clock signal FCLK.

Fuse group 24 nonvolatilely stores the respective bit values corresponding to the address of the faulty memory cell row. Fuse group 24 includes a plurality of fuse units HU provided corresponding to the respective bits forming the faulty address, which represents the faulty memory cell row, as well as transistors PT. For example, transistor PT is a P-channel MOS transistor. Transistor PT is arranged between power supply voltage VCC and an output node Nh, and has a gate receiving clock signal FCLK.

The plurality of fuse units HU are connected in parallel to node Nh. As described above, fuse unit HU is provided corresponding to each of the bits representing the faulty address. Fuse unit HU includes a fuse element HE and a transistor AT. For example, transistor AT is an N-channel MOS transistor.

Fuse element HE and transistor AT are connected in series between ground voltage GND and output node Nh. Transistor AT electrically couples fuse element HE to node Nh in response to the input of decode signal SF. Fuse element HE may be formed of a laser fuse, which can be electrically blown off in response to external application of laser, or an electrical fuse, which can be electrically blown off by application of a high voltage. By electrically blowing or leaving fuse elements HE, the respective bits of the faulty address can be nonvolatilely stored. Fuse group 24 provides, as a control signal FOUT, the signal transmitted to node Nh.

More specifically, if fuse element HE is blown in fuse unit HU, output node Nh attains the "H" level when corresponding transistor AT is turned on. If fuse element HE is not blown, output node Nh attains the "L" level. These voltage levels on output node Nh correspond to "0" and "1" of the faulty address, respectively.

Fuse register 25 latches control signal FOUT provided from fuse group 24, and transmits it, as faulty address F[i:0], to address comparing circuit 26. FIG. 5 shows, as a typical example, a circuit provided in fuse register 25 for holding faulty address F<0> of one bit in accordance with the input of control signal FOUT. In the following description, the "H" and "L" levels relate to "1" and "0", respectively. For example, when control signal FOUT at the "H" level is input, faulty address F<0> is "1". When control signal FOUT at the "L" level is input, faulty address F<0> is "0".

Fuse register 25 includes transistor NT0 and a latch circuit 25L. Transistor NT0 transmits control signal FOUT to latch circuit 25L in response to the input of corresponding decode signal SF<0>. Latch circuit 25L includes inverters 25Ia–25Ic. Inverters 25Ia and 25Ib are cross coupled. Inverter 25Ic inverts the output signal of inverter 25Ia, and provides the inverted signal as faulty address F<0>. Therefore, faulty address F<0> attains the same logical level as transmitted control signal FOUT. Bits of the other faulty addresses are set similarly. For example, transistor NT0 is an N-channel MOS transistor.

Description will now be given on storage of the faulty address of fuse registers 25. Decode signal SF is produced in accordance with the counting by counter circuit 21. In response to this production of decode signal SF, fuse unit HU in fuse group 24 corresponding to the respective bits of the faulty address is selected to produce control signal FOUT. Fuse register 25 stores control signal FOUT bit by bit in response to decode signal SF. By this operation, the faulty address is set in fuse register 25.

Counter circuit 23 includes an AND circuit AD0 and flip-flop circuits FFb0–FFbi−1 connected in series. AND circuit AD0 transmits a result of the AND operation conducted between clock signal FCLK and control signal EN to first flip-flop circuit FFb0 connected in series to second and higher flip-flop circuits.

Counter circuit 21 transmits control signal EN at the "H" level when a predetermined count value is attained. Therefore, counter circuit 23 starts the counting of a counter address R[i:0] after the predetermined count of counter circuit 21.

Address comparing circuit 26 compares counter address R[i:0] provided from counter circuit 23 with faulty address F[i:0] latched by fuse register 25, and provides a control signal HT based on a result of the comparison. Address comparing circuit 26 includes an exclusive OR circuit EOR comparing counter address R[i:0] with faulty address F[i:0] bit by bit, an NOR circuit NR1, which receives a result provided from exclusive OR circuit EOR, and provides a result of the NOR operation, and an AND circuit AD1, which receives the result provided from NOR circuit NR1, and provides a result of the AND logical operation.

Address comparing circuit 26 provides control signal HT at the "H" level when faulty address F[i:0] latched by fuse register 25 entirely matches with counter address R[i:0], which is being incremented by the counting of counter circuit 23. In this case, all the output signals of exclusive OR circuit EOR attain the "L" level. Thereby, all the NOR circuits NR1 provide the signals at the "H" level. Therefore, AND circuit AD1 sets control signal HT at the "H" level.

Fuse data generating circuit 27 includes an NAND circuit ND, inverters 27Ia–27Ic, and a transistor NT1. Transistor NT1 is, e.g., an N-channel MOS transistor. Transistor NT1 is arranged between ground voltage GND and a node Na, and has a gate receiving control signal HT. Inverter 27Ia inverts the signal transmitted to node Na, and transmits it to a node Nb. NAND circuit ND transmits a result of an NAND operation, which is conducted between a control signal RST and the signal transmitted to node Nb, to node Na. Inverters 27Ib and 27Ic are connected in series, and produce fuse data FD from the signal transmitted to node Nb. Fuse data FD determines shift control signals S and ZS instructing the shift operation in the row decoder and match line amplifier 3 of this embodiment.

Fuse data generating circuit 27 in the initial state latches node Na at the "H" level. Therefore, fuse data FD attains the "L" level. Ground voltage GND is electrically coupled to node Na in accordance with control signal HT at the "H" level provided from address comparing circuit 26. Thereby, node Na attains the "L" level, and fuse data FD attains the "H" level. Control signal RST in the initial state is at the "H" level. Therefore, NAND circuit ND latches node Na at the "L" level in accordance with control signal RST and the input on node Nb. By setting control signal RST to the "L" level, node Na can be reset to the initial state.

Two-phase clock generating circuit 28 includes flip-flop circuits FFc0 and FFc1, an AND circuit AD2 and an NOR circuit NRR. Flip-flop circuits FFc0 and FFc1 become active in response to the input of control signal EN. AND circuit AD2 and NOR circuit NRR output, as clock signals FCLK1 and FCLK2, the results of the AND operation and the NOR operation, each of which is conducted between the signals transmitted from output nodes Q of flip-flop circuits FFc0 and FFc1, respectively.

Flip-flop circuit FFc0 receives clock signal FCLK, and flip-flop circuit FFc1 receives an inverted signal of clock signal FCLK. Therefore, the signals transmitted from output nodes Q of flip-flop circuits FFc0 and FFc1 have signal waveforms shifted by half a cycle from input clock signal FCLK. Thereby, clock signals FCLK1 and FCLK2, which are provided from AND circuit AD2 and NOR circuit NRR, respectively, have the waveforms prepared by dividing input clock signal FCLK into two-phase clock signals of the same pulse width. In other words, a combination of clock signals FCLK1 and FCLK2 corresponds to clock signal FCLK.

Referring to a timing chart of FIG. 6, description will now be given on an operation of fuse circuit 20 shown in FIG. 5.

Figure 6:
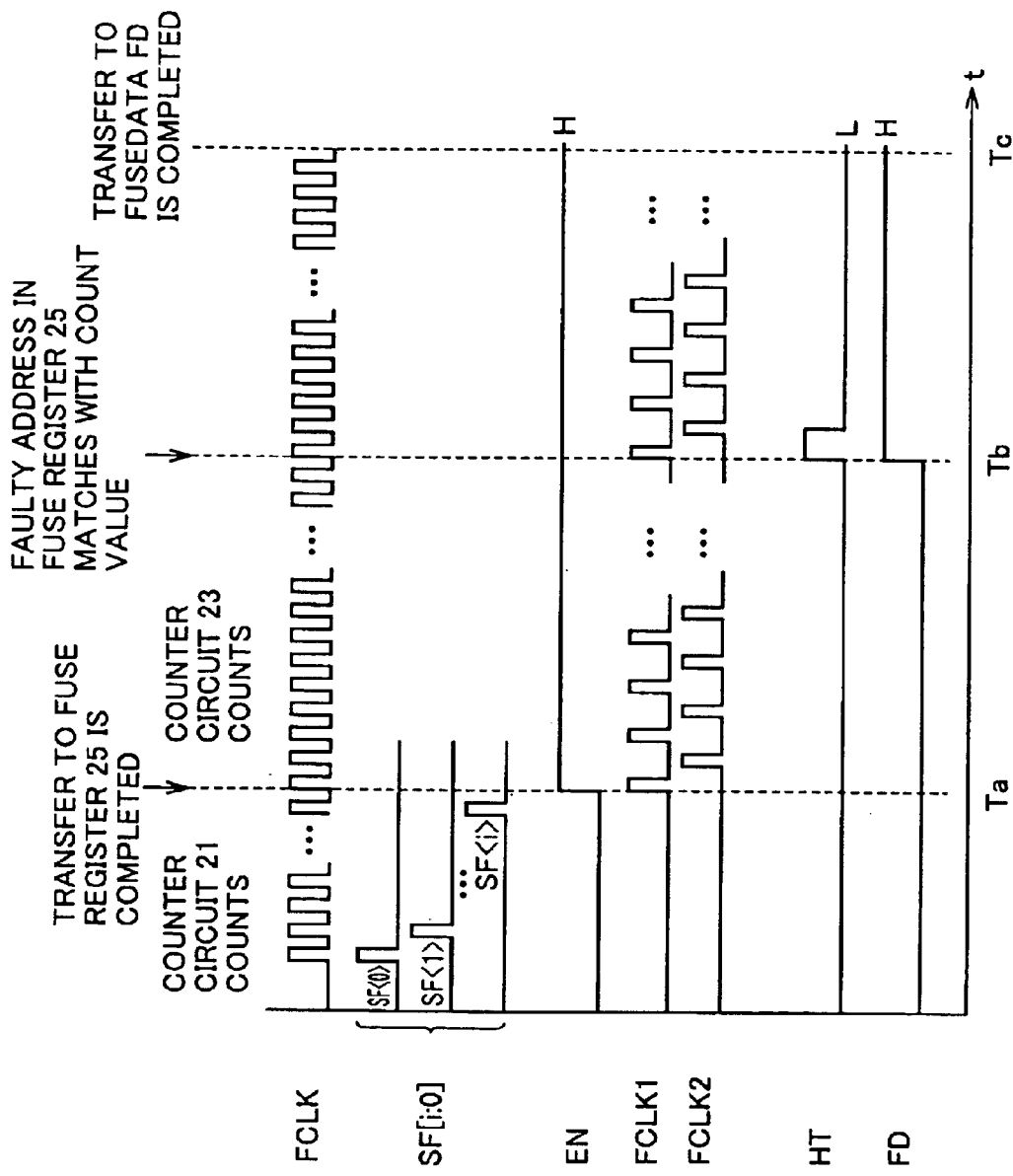
FIG. 6 is a timing chart illustrating an operation of the fuse circuit.

Referring to FIG. 6, control circuit 10 provides clock signal FCLK. In response to this, counter circuit 21 starts the counting to produce counter address FADD[j−1:0]. Counter address FADD[j−1:0] produced based on this counting of counter circuit 21 is supplied to decoder circuit 22. Decode signals SF<0>–SF<i> are set to the "H" level one by one in ascending order. In accordance with decode signals SF thus set, fuse units HU of fuse group 24 are activated one by one, and fuse register 25 stores faulty address F[i:0].

At a time Ta, counter circuit 21 reaches a predetermined count value. Thereby, transfer (storage) of faulty address F[i:0] to fuse register 25 is completed. In accordance with similar timing, counter circuit 21 produces control signal EN at the "H" level based on the input of a predetermined counter address value.

In accordance with the input of this control signal EN at the "H" level, counter circuit 23 becomes active to start the counting of counter address R[i:0].

Two-phase clock generating circuit 28 provides clock signals FCLK1 and FCLK2 divided into two phases in response to the input of control signal EN at the "H" level.

At a next time Tb, counter address R[i:0] is incremented so that the faulty address of fuse register 25 matches with count value in address comparing circuit 26. In accordance with this, control signal HT is set to the "H" level.

In accordance with the input of control signal HT at the "H" level, fuse data generating circuit 27 continuously latches and provides fuse data FD of "1" ("H" level). In the initial state, fuse data FD of "0" ("L" level) is continuously latched and provided.

At a time Tc, transfer of fuse data FD is completed.

Then, latch portion LTU operates in synchronization with clock signals FCLK1 and FCLK2, which are supplied to input nodes FCLKA and FCLKB, respectively, and latches input fuse data FD to set shift control signals S and ZS. Also, latch portion LTU transmits control signal EN at the "H" level to latch portion LTU in the next stage. Input nodes FCLKA and FCLKB in each of alternate latch portions LTU are supplied with clock signals FCLK1 and FCLK2, which are opposite to those supplied to input nodes FCLKA and FCLKB in the neighboring latch portion LTU, respectively. More specifically, as shown in FIG. 2, input nodes FCLKA and FCLKB of first latch portion LTU (i.e., latch portion LTU in the first stage) are supplied with clock signals FCLK2 and FCLK1, respectively. Input nodes FCLKA and FCLKB of second latch portion LTU (i.e., latch portion LTU in the second stage) are supplied with clock signals FCLK1 and FCLK2, respectively. The subsequent latch portions LTU are supplied with clock signals FCLK1 and FCLK2 in a similar manner.

Figure 7:
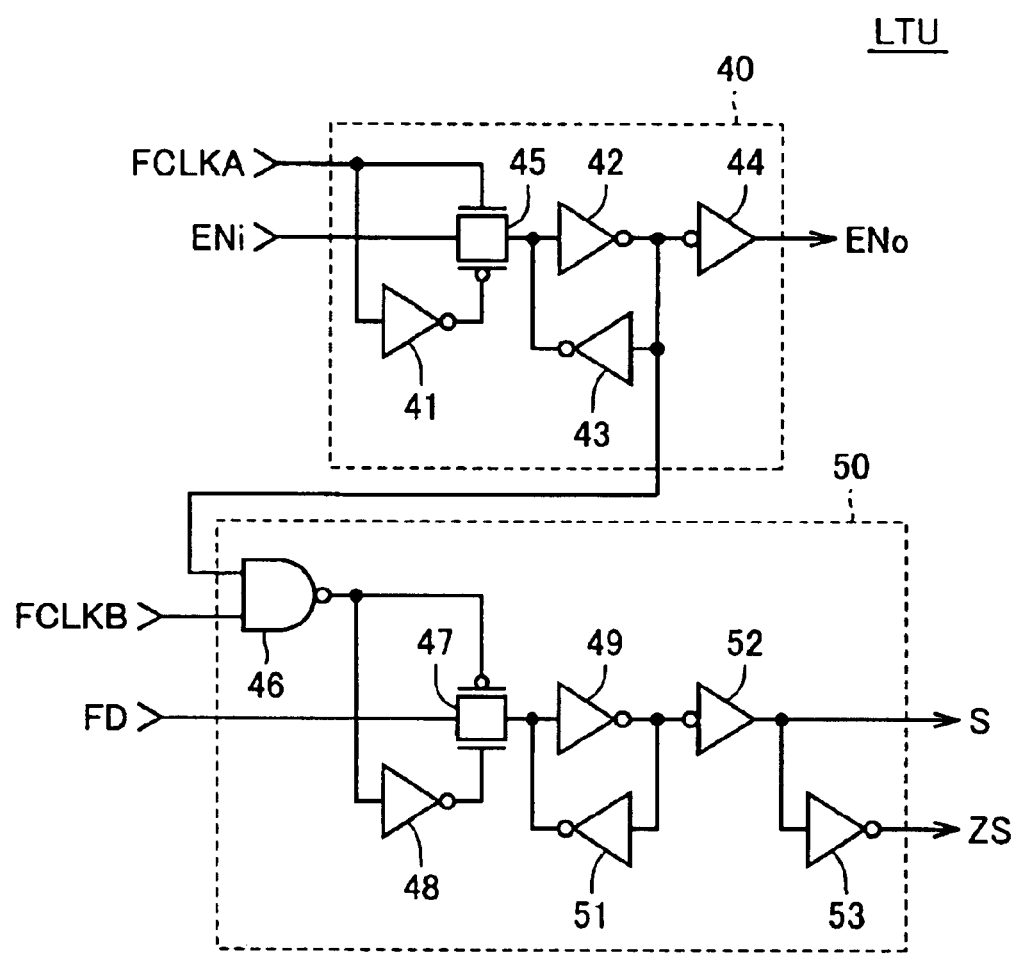
FIG. 7 shows a circuit structure of latch portions connected in series in a shift information latch circuit.

Referring to FIG. 7, latch portion LTU according to the embodiment of the invention includes latch circuits 40 and 50.

Latch circuit 40 includes inverters 41–44 and a transfer gate 45.

Transfer gate 45 becomes active in response to clock signal FCLK1 (FCLK2) transmitted to input node FCLKA and an inverted signal of clock signal FCLK1 (FCLK2) transmitted via inverter 41, and thereby provides a signal received on an input node ENi to inverter 42. Inverter 42 inverts the signal, which is transmitted from input node ENi through transfer gate 45, to provide it to inverter 44. Inverters 42 and 43 are cross coupled. Inverter 44 transmits the inverted signal of inverter 42 to an output node ENo. In the initial state, latch circuit 40 latches the output signal of inverter 42 at the "H" level. Therefore, control signal EN is set to the "L" level in the initial state.

Latch circuit 50 includes an NAND circuit 46, a transfer gate 47 and inverters 48–53.

Inverters 49 and 51 are cross-coupled. Inverter 52 inverts an output signal of inverter 49 to provide shift control signal S. Further, inverter 53 inverts shift control signal S to provide shift control signal ZS. NAND circuit 46 provides a result of an NAND operation conducted between clock signal FCLK2 (FCLK1) supplied from input node FCLKB and the signal provided from inverter 42. Transfer gate 47 becomes active in response to the output signal of NAND circuit 46 and the inverted signal transmitted from inverter 48, and provides fuse data FD to inverter 49.

The operation of latch portion LTU will now be described. In latch circuit 50, the output signal of NAND circuit 46 attains the "L" level in accordance with the output signal at the "H" level of inverter 42, which is latched by latch circuit 40 in the initial state at the time of rising ("H" level) of the clock signal supplied to input node FCLKB. In response to this, transfer gate 47 is turned on, and inverters 49 and 51 latch fuse data FD. In latch circuit 40, transfer gate 45 is then turned on in synchronization with the rising ("H" level) of the clock signal supplied to input node FCLKA. Thereby, control signal EN ("H" level) supplied to input node ENi is latched by inverters 42 and 43, and is transmitted to output node ENo.

Figure 8:
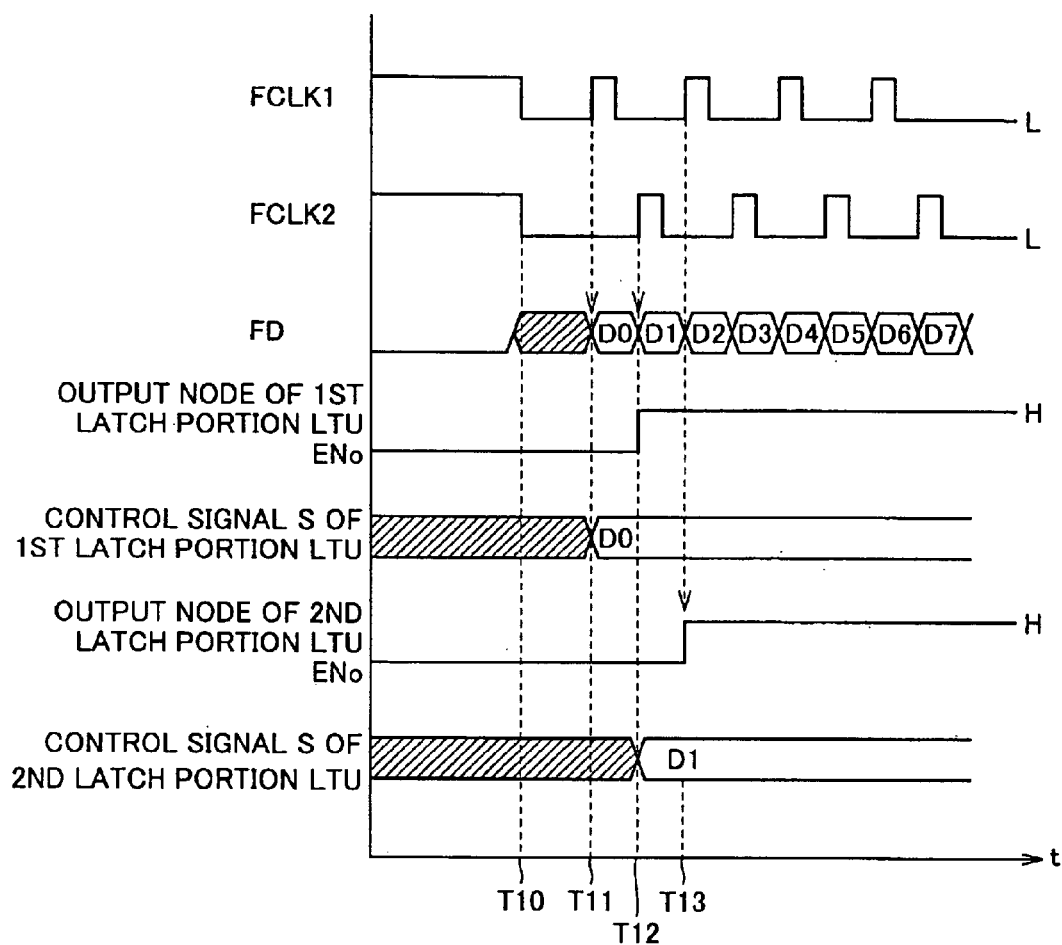
FIG. 8 is a timing chart illustrating an operation of the latch portion in the shift information latch circuit according to the embodiment of the invention.

Referring to a timing chart of FIG. 8, description will now be given on the operation of latch portion LTU of the shift information latch circuit according to the embodiment of the invention. Particularly, an operation of the latch portions LTU in the first and second stages will be described. As already described, input nodes FCLKA and FCLKB of first latch portion LTU receive clock signals FCLK2 and FCLK1, respectively. Input nodes FCLKA and FCLKB of second latch portion LTU receive clock signals FCLK1 and FCLK2, respectively.

At a time T10, the counter address of counter circuit 21 reaches a predetermined count value. At a next time T11, counter circuit 21 produces control signal EN at the "H" level as already described. Thereby, two-phase clock generating circuit 28 produces clock signals FCLK1 and FCLK2. Time T1 is the same as time Ta illustrated in the timing chart of FIG. 6. At and after time T11, the plurality of latch portions LTU connected in series successively take in fuse data FD in the shift information latch circuit.

More specifically, first latch portion LTU latches fuse data FD (D0) by inverters 49 and 51 at time T1 in synchronization with the rising of clock signal FCLK1 supplied to input node FCLKB. Thereby, shift control signals S and ZS are set.

At a subsequent time T12, inverters 49 and 50 latch control signal EN ("H" level) in synchronization with the rising of clock signal FCLK2 applied to input node FCLKA. Output node ENo is set to the "H" level, and transmits control signal EN ("H" level) to the next stage. In this case, the output signal of inverter 49 is set to the "L" level. Therefore, NAND circuit 46 of latch circuit 50 always receives the signal at the "L" level from inverter 49, and thereby, transfer gate 47 is always off. In accordance with this operation, first latch portion LTU continues latching of shift control signals S and ZS produced based on applied fuse data FD (D0).

Second latch portion LTU likewise latches fuse data FD (D1) by inverters 49 and 51 at a time T12 in synchronization with the rising of clock signal FCLK2 applied to input node FCLKB. Thereby, shift control signals S and ZS are set. At a subsequent time T13, inverters 42 and 43 latch control signal EN ("H" level) in synchronization with the rising of clock signal FCLK1 applied to input node FCLKA. Thereby, control signal EN ("H" level) is transmitted to the next stage as already described. In this state, NAND circuit 46 of latch circuit 50 always receives the signal at the "L" level from inverter 49, and therefore transfer gate 47 is always off. Accordingly, second latch portion LTU continuously latches shift control signals S and ZS produced based on applied fuse data FD (D1), similarly to the first latch portion LTU.

Thereafter, similar operations are repeated so that fuse data FD is successively provided to the plurality of latch portions LTU of shift information latch circuit 6 in ascending order, and shift control signals S and ZS based on applied fuse data FD are set in each latch portion LTU.

In row decoder 5, the select operation is performed based on predecode signals XA, XB and XC transmitted from predecode circuit 15, and the shift operation is performed based on the shift information transmitted from shift information latch circuit 6. Structures for executing these operations will now be described.

Figure 9:
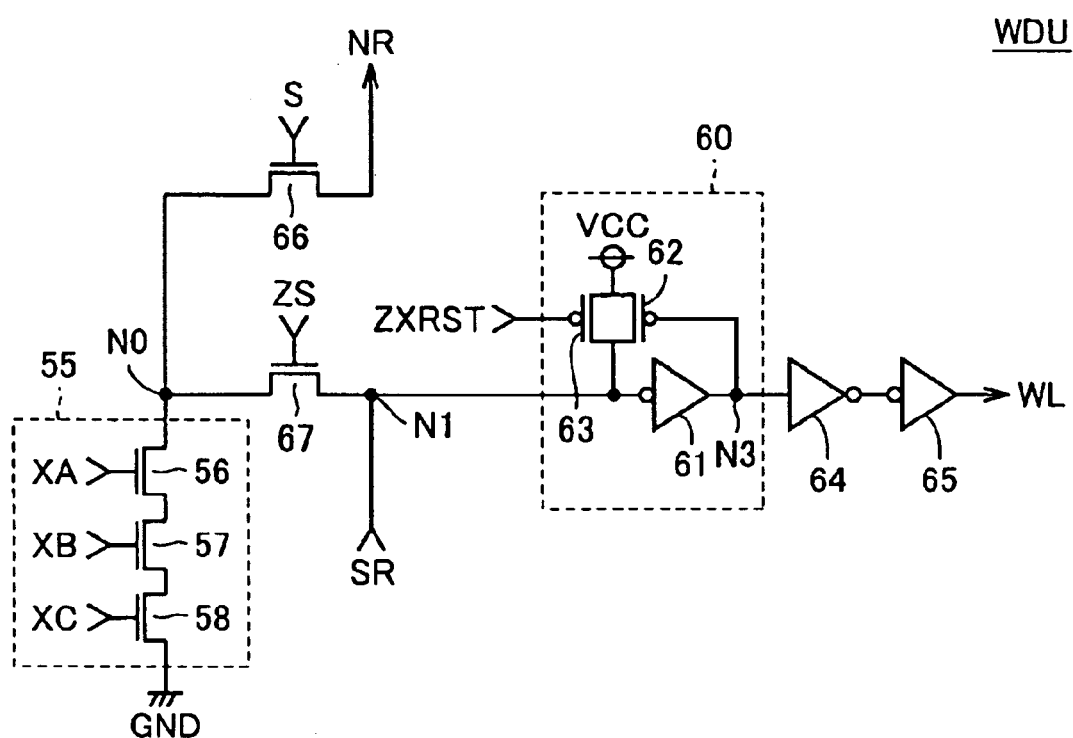
FIG. 9 shows a circuit structure of a word line select unit according to the embodiment of the invention.

Referring to FIG. 9, word line select unit WDU according to the embodiment of the invention includes a select portion 55, a reset portion 60, inverters 64 and 65, and transistors 66 and 67.

Select portion 55 produces a select signal for selecting word line WL to node N0 in accordance with input of predecode signals XA, XB and XC.

Select portion 55 includes transistors 56–58. Transistors 56–58 are arranged in series between node N0 and ground voltage GND, and have gates receiving predecode signals XA, XB and XC, respectively. Transistors 56–58, 66 and 67 are, e.g., N-channel MOS transistors.

In FIG. 9, predecode circuit 15 provides predecode signals XA[j:0], XB[k:0] and XC[l:0]. Only one transistor is shown as each kind of transistors 56–58 corresponding to respective predecode signals XA, XB and XC. However, a plurality of transistors arranged in series are employed for the respective bits of each of predecode signals XA, XB and XC, although not shown. Alternatively, such a structure may be employed that transistors 56–58 receive signals, which become active in accordance with predetermined combinations of predecode signals XA, XB and XC.

For the sake of simplicity, it is assumed in the following description that signals XA, XB and XC are at the "H" level when the predetermined combination of predecode signals XA, XB and XC is present.

Transistor 66 is arranged between node N0 and output node NR, and receives shift control signal S on its gate. Transistor 67 is arranged between nodes N0 and N1, and receives shift control signal ZS on its gate. Further, node N1 is electrically connected to input node SR.

Reset portion 60 is arranged between nodes N1 and N3, and resets node N3 to the initial state ("L" level) in response to the input of control signal ZXRST ("L" level). Reset portion 60 includes an inverter 61 and transistors 62 and 63. Transistors 62 and 63 are, e.g., P-channel MOS transistors.

Inverter 61 inverts the signal transmitted to node N1, and outputs to node N3. Transistor 62 is arranged between power supply voltage VCC and node N1, and has a gate electrically coupled to node N3. Transistor 63, is arranged in parallel with transistor 62, is connected between power supply voltage VCC and node N1, and has a gate receiving control signal ZXRST.

Inverters 64 and 65 are connected in series, and activate corresponding word line WL based on the signal transmitted to node N3. More specifically, inverters 64 and 65 activate corresponding word line WL when node N3 attains the "H" level. When node N3 is at the "L" level, corresponding word line WL becomes inactive.

For example, when all predecode signals XA, XB and XC are set to the "H" level, select portion 55 becomes active, and the operation of accessing (selecting) corresponding word line WL is executed. In the above operation, it is assumed that shift control signals S and ZS are at the "L" and "H" levels, respectively. In this case, node N0 is set to the "L" level in the select portion, and corresponding word line WL is activated through inverters 61, 64 and 65.

When shift control signals S and ZS are at the "H" and "L" levels, respectively, the operation is performed as follows. In this case, word line select unit WDU performs the shift operation. More specifically, transistor 66 is turned on in response to shift control signal S ("H" level). Thereby, the voltage level ("H" level) on node N0 is transmitted to output node NR, and the voltage level ("H" level) on node N0 is transmitted to input node SR of word line select unit WDU in the next (higher) stage. Thereby, the word line corresponding to word line select unit WDU in the next stage (on the higher address side) becomes active.

Figure 10:
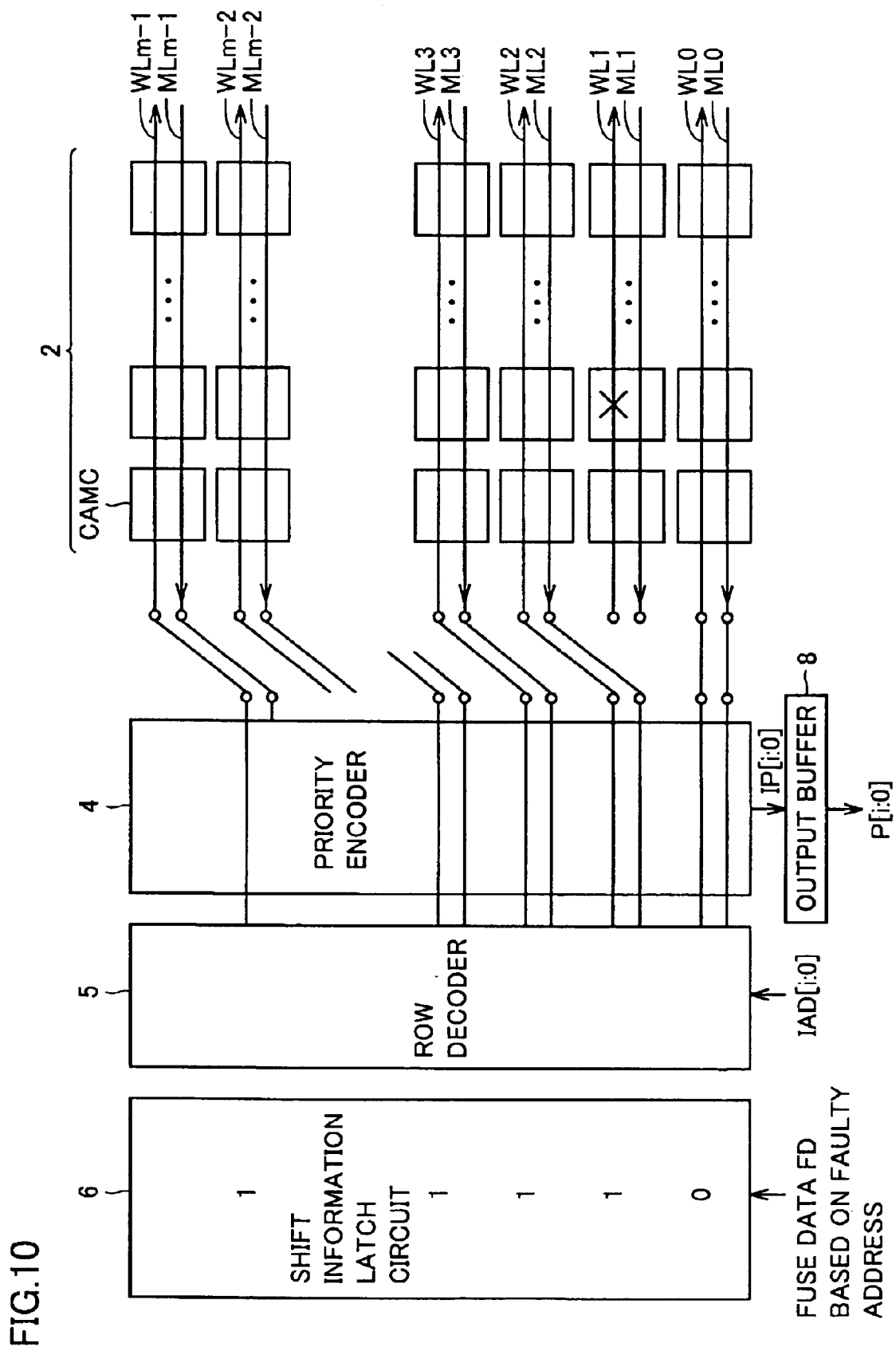
FIG. 10 schematically and conceptually illustrates a shift operation executed by a row decoder and a match line amplifier based on fuse data latched by the shift information latch circuit.

Referring to FIG. 10, it is assumed that word line WL1 is faulty, and the faulty address corresponding to word line WL1 is stored in fuse group 24 of fuse circuit 20.

Therefore, latch portion LTU in the first stage of shift information latch circuit 6 is supplied with fuse data FD of "0", and latch portions LTU in the second and higher stages are supplied with fuse data FD of "1".

In this case, latch portion LTU in the first stage sets shift control signals S and ZS to the "L" and "H" levels in response to fuse data FD of "0" as described above, respectively. Latch portion LTU in the second and higher stages set shift control signals S and ZS to the "H" and "L" levels in response to fuse data FD of "1" as described above, respectively.

Therefore, word line select unit WDU in the first stage of row decoder 5 is electrically coupled to corresponding word line WL based on shift control signals S and ZS.

Word line select units WDU in the second and higher stages of row decoder 5 are electrically coupled to the word lines WL corresponding to the addresses, which are higher by one stage, based on shift control signals S and ZS.

Thereby, the shift operation is executed not to access faulty word line WL1, and the word line corresponding to the faulty memory cell row can be repaired by using the redundant word line.

The shift operation executed in connection with match line ML will now be described.

Figure 11:
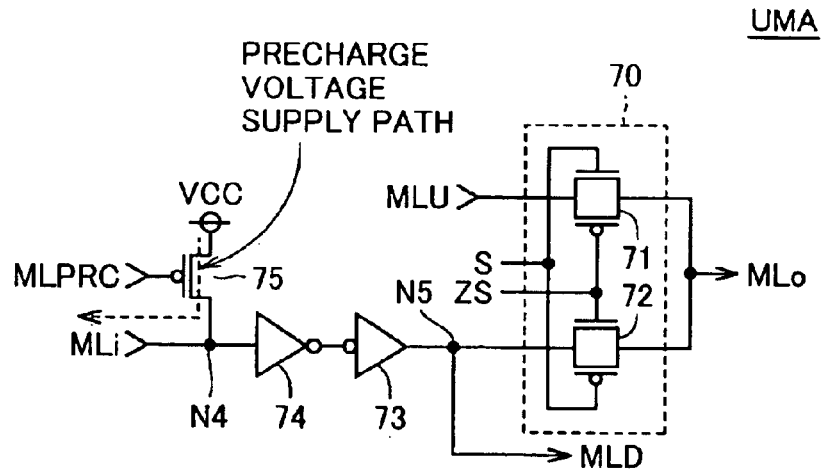
FIG. 11 shows a circuit structure of a match amplifier unit according to the first embodiment of the invention.

Referring to FIG. 11, match amplifier unit UMA according to the first embodiment of the invention includes a transistor 75, inverters 73 and 74, and a switch circuit 70. Transistor 75 is, e.g., a P-channel MOS transistor.

Transistor 75 is arranged between power supply voltage VCC and a node N4, and has a gate receiving control signal MLPRC. Before the data retrieving operation, control circuit 10 sets control signal MLPRC ("H" level) to the "L" level. Thereby, transistor 75 is turned on to connect electrically power supply voltage VCC to node N4. Thereby, input node MLi connected to corresponding match line ML is electrically connected to power supply voltage VCC, and the precharge operation is executed. In FIG. 11, dotted line with an arrow represents a voltage supply path of power supply voltage VCC, which is formed during the precharging.

Inverters 73 and 74 are connected in series between nodes N4 and N5. Node N4 is electrically coupled to input node MLi, and input node MLi is electrically coupled to corresponding match line ML. Node N5 is electrically coupled to an output node MLD, which transmits the signal sent to node N5 to match amplifier unit UMA corresponding to the lower address (lower stage).

Switch circuit 70 selects either the signal, which is transmitted to input node MLU from match amplifier unit UMA corresponding to a higher address (higher stage), or the signal transmitted to node N5 based on shift control signals S and ZS, and transmits the signal thus selected to output node MLo.

Switch circuit 70 includes transfer gates 71 and 72. Transfer gate 71 is arranged between input node MLU and output node MLo. Transfer gate 72 is arranged between node N5 and output node MLo. Transfer gates 71 and 72 operate complementarily to each other based on shift control signals S and ZS.

More specifically, when shift control signals S and ZS are set to the "L" and "H" levels, respectively, node N5 is electrically coupled to output node MLo. Therefore, the signal transmitted to node N5 is transmitted to output node MLo as it is.

When shift control signals S and ZS are set to the "H" and "L" levels, respectively, input node MLU is electrically coupled to output node MLo. Therefore, the signal transmitted from match amplifier unit UMA corresponding to a higher address is transmitted to output node MLo. In this case, the signal transmitted to node N5 is transmitted to match amplifier unit UMA corresponding to a lower address via output node MLD.

Therefore, the shift operation of shifting the signal transmitted to match line ML is executed based on shift control signals S and ZS.

Referring to FIG. 10 again, description will now be given on the case where fuse data FD supplied to shift information latch circuit 6 is the same as that in the foregoing example.

In this case, match amplifier units UMA in the second and higher stages set such a state that shift control signals S and ZS are at the "H" and "L" levels, respectively, and therefore, input node MLU is electrically coupled to output node MLo. Thus, the signal set by match amplifier unit UMA corresponding to the higher address (higher stage) is transmitted to output node MLo via input node MLU.

In match amplifier unit UMA in the first stage, since shift control signals S and ZS are set to the "L" and "H" levels, respectively, node N5 is electrically coupled to output node MLo, and the signal transmitted to node N5 is transmitted to output node MLo as it is.

By executing the above shift operation during the access operations for data reading and writing, the operation shifted by one stage to a higher address in row decoder 5 can be shifted again to a lower address by one stage in the data retrieving operation. Thereby, it is possible to transmit a signal indicating an original logical address position to priority encoder 4 described below.

Figure 12:
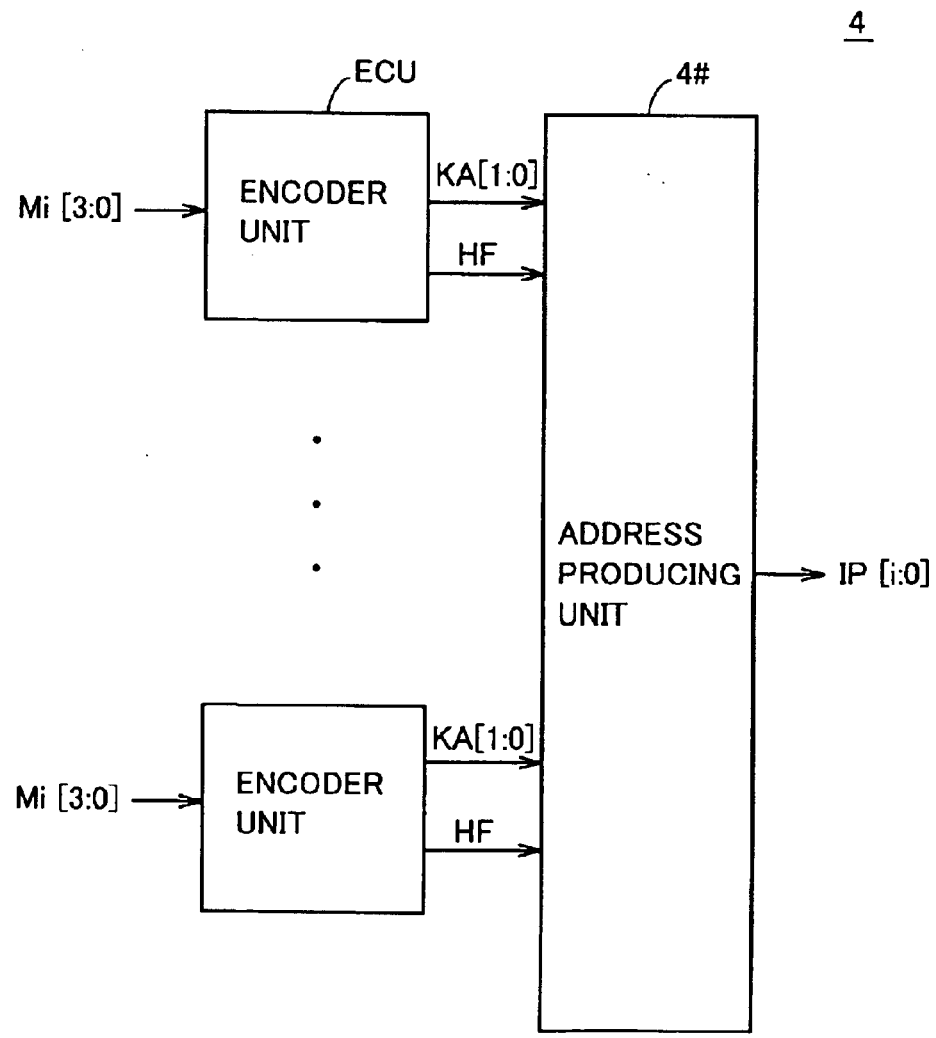
FIG. 12 is a schematic block diagram of a priority encoder according to the embodiment of the invention.

Referring to FIG. 12, priority encoder 4 according to the embodiment of the invention includes a plurality of encoder units ECU provided corresponding to the respective memory cell rows, and an address producing unit 4#.

Each of the plurality of encoder units ECU receives four bits of a match signal Mi[3:0] provided from corresponding four match amplifier units UMA of match line amplifier 3, and transmits two bits of an address KA[1:0] and a control signal HF to address producing unit 4#.

Based on two-bit addresses KA[1:0] and control signals HF transmitted from the plurality of encoder units ECU, address producing unit 4# produces address IP[i:0] of the memory cell row corresponding to the highest address among the memory cell rows, which are hit in the data retrieving operation.

Figure 13:
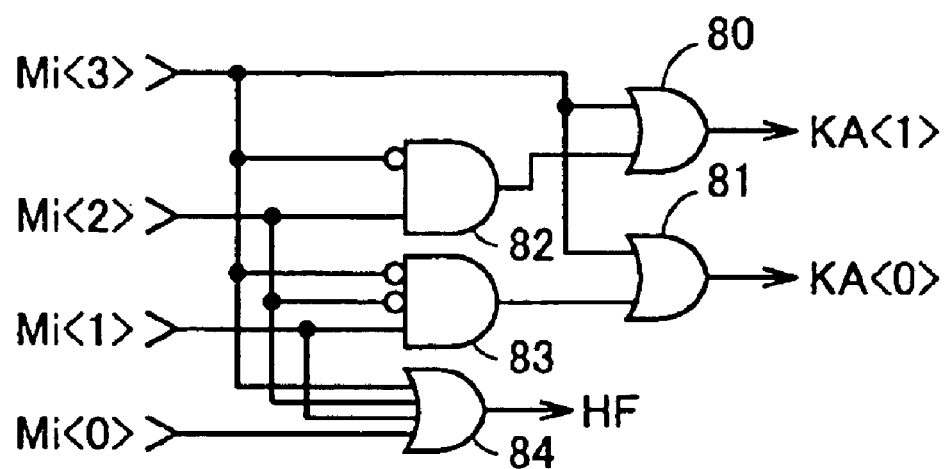
FIG. 13 shows a circuit structure of an encoder unit according to the embodiment of the invention.

Referring to FIG. 13, encoder unit ECU according to the embodiment of the invention includes OR circuits 80, 81 and 84, and AND circuits 82 and 83.

Encoder unit ECU produces encoded address KA[1:0] based on input of match signal Mi[3:0].

OR circuit 80 receives match signal Mi<3> and the output signal of AND circuit 82, and provides a result of the OR operation conducted between them as address KA<1>. AND circuit 82 receives an inverted signal of match signal Mi<3> and match signal Mi<2>, and provides a result of the AND operation conducted between them to OR circuit 80. AND circuit 83 receives an inverted signal of match signal Mi<3>, an inverted signal of match signal Mi<2> and match signal Mi, and provides a result of the AND operation conducted on them to OR circuit 81. OR circuit 81 receives match signal Mi<3> and the output of AND circuit 83, and provides a result of the OR operation conducted between them as an address KA<0>. OR circuit 84 receives match signals Mi<0>–Mi<3>, and provides a result of the OR operation conducted on them as control signal HF.

More specifically, when match signal Mi, which corresponds to a higher address, among supplied match signals Mi<0>–Mi<3> is input, higher address KA[1:0] is produced. For example, when match signal Mi<3> is set to the "H" level, encoded address KA[1:0] is set to "11". When one of match signal Mi is "1", control signal HF is set to "1".

Address producing unit 4# produces address IP[i:0], which is the highest address among the hit memory cell rows, based on address KA[1:0] produced by each encoder unit ECU and control signal HF. For example, a higher priority is assigned to control signal HF produced by encoder unit ECU on the highest address side, and the value of address KA[1:0] produced by encoder unit ECU on the highest address side is used as it is. Also, all the values of addresses KA[1:0] produced by the other encoder units on the lower address side are ignored. In this manner, address IP[i:0] can be produced.

Address IP[i:0] thus produced is externally output as address P[i:0] through output buffer 8.

In this structure, therefore, row decoder 5 can execute the shift operation to prevent access to a faulty memory cell row based on fuse data FD provided to shift information latch circuit 6. In match line amplifier 3, the memory cell row shifted by the shift operation is shifted again based on fuse data FD so that it may be input to priority encoder 4 as the input of the memory cell row in the original logical address position, whereby the address of the appropriate memory cell row in the highest position can be output.

In this structure, since the shift operation is executed based on shift control signals S and ZS, which are produced in accordance with fuse data FD latched by shift information latch circuit 6, it is not necessary to arrange a decoder circuit used for decoding of the faulty address. It is not necessary to arrange a signal line, which must be employed for transmitting the input address in the structure employing the decoder circuit, so that the circuit area can be reduced. By reducing the number of interconnections, the interconnection layout can be simple, which facilitates circuit designing.

Since row decoder 5 neighbors to priority encoder 4 in the above structure, it is not necessary to arrange, on the memory array, the signal lines transmitting the shift control signal from the shift control latch circuit. Therefore, the interconnection efficiency can be improved.

In the above embodiment, the structure using the shift information latch circuit has been described as an example of the control circuit for executing the shift operation based on the faulty address. However, this structure is not restrictive, and the shift operation can be executed by another structure.

First Modification of the First Embodiment

A first modification of the first embodiment will now be described in connection with a structure of a row decoder 5#, which can be substituted for row decoder 5 executing the shift operation based on the shift control signal.

Figure 14:
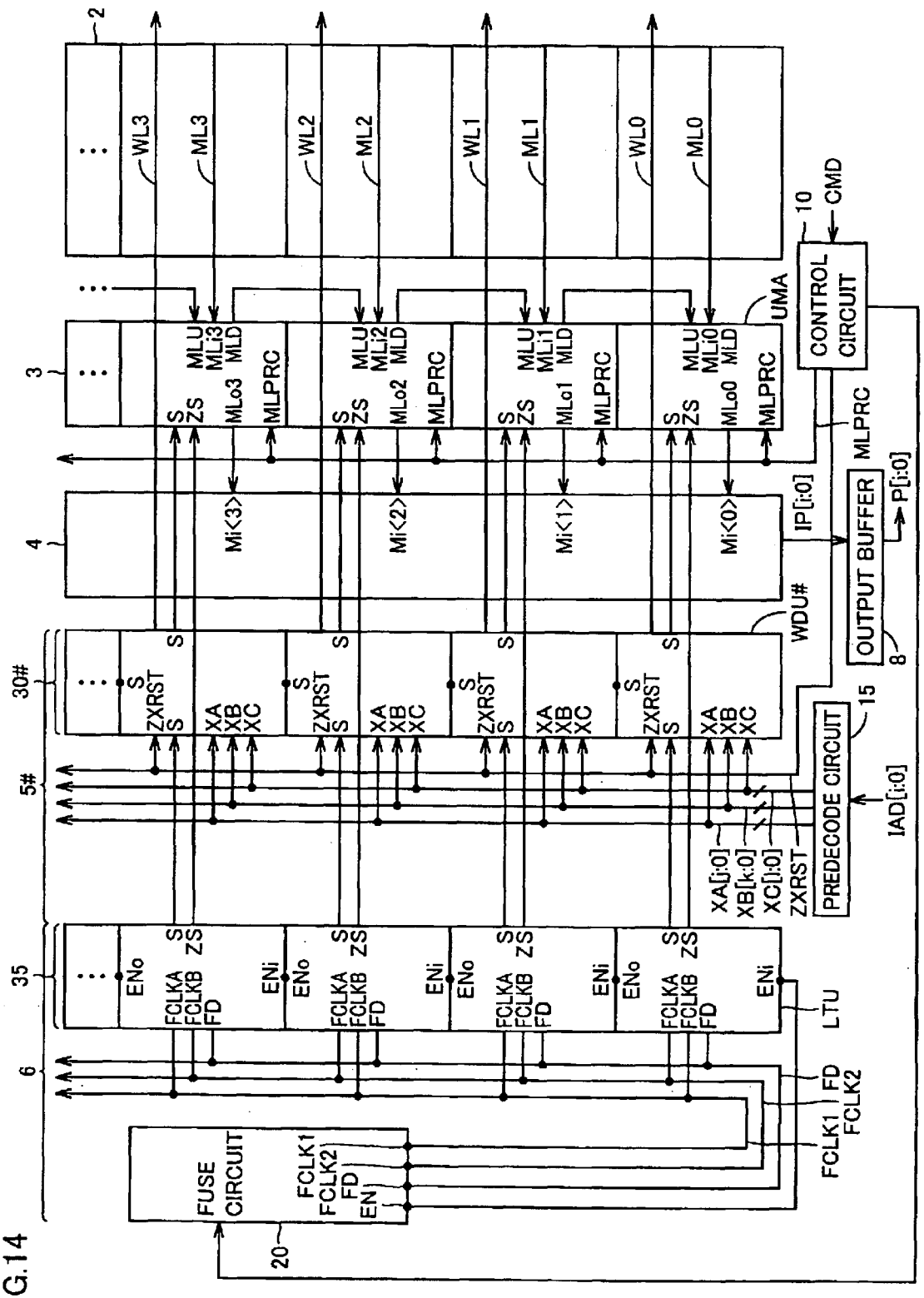
FIG. 14 is a schematic block diagram specifically showing a first modification of the first embodiment of the invention.

Referring to FIG. 14, a difference from the block diagram of FIG. 2 is that row decoder 5# is employed instead of row decoder 5. Other structures are substantially the same as those already described with reference to FIG. 2, and therefore, description thereof is not repeated.

Row decoder 5# differs from row decoder 5 in that a word line select circuit 30# is employed instead of word line select circuit 30. Other structures are substantially the same as those of row decoder 5, and therefore, description thereof is not repeated.

Word line select circuit 30# includes a plurality of word line select units WDU# provided corresponding to the memory cell rows, respectively.

Figure 15:
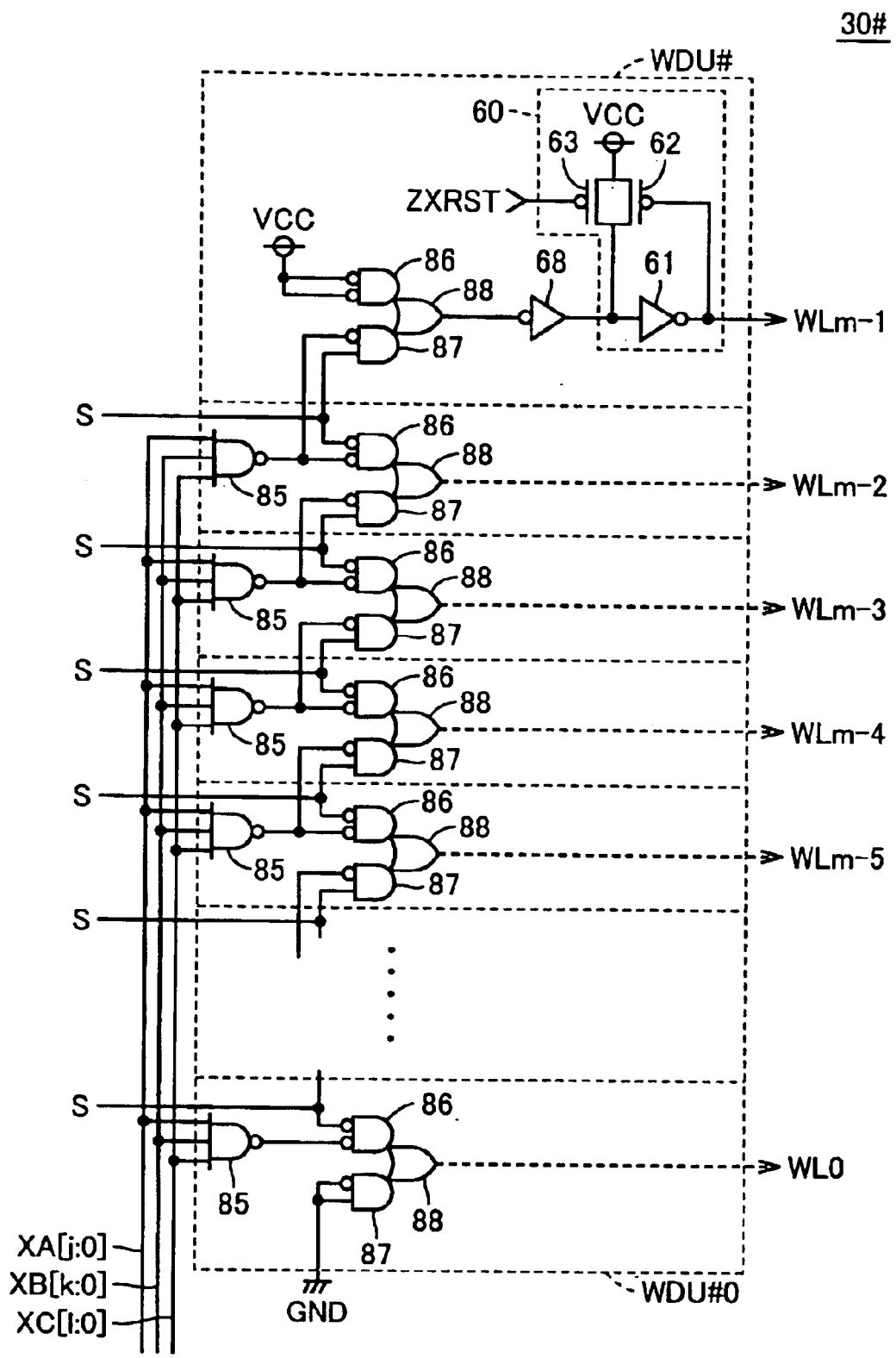
FIG. 15 shows a circuit structure of a plurality of word line select units according to the first modification of the first embodiment of the invention.

FIG. 15 shows a structure of a plurality of word line select units WDU# according to the first modification of the first embodiment of the invention, and more specifically shows, by way of example, word lines WL0–WLm−1 as well as a plurality of word line select units WDU# arranged corresponding to word lines WL–WLm−1, respectively. Word line select units WDU# collectively or generally represent the plurality of word line select units. Word line WLm−1 is arranged as a redundant word line.

Except for word line select unit WDU# corresponding to word line WLm−1 at the uppermost stage or position in FIG. 15, all word line select units WDU# have the same structure.

For example, word line select unit WDU# corresponding to word line WLm−2 will now be described.

Word line select unit WDU# includes a logical unit 85, which issues a signal at "L" level in accordance with a predetermined combination of predecode signals XA, XB and XC applied thereto, an AND circuit 86, which receives an inverted signal of shift control signal S and an inverted signal applied from logical unit 85, and provides a result of an AND operation performed between them, an AND circuit 87, which receives an inverted signal of the output signal of logical unit 85 of the word line select unit in a preceding stage corresponding to word line WLm−3 as well as a shift control signal supplied to the word line select unit in the preceding stage, and provides a result of an AND operation performed between them, an OR circuit 88 receiving outputs of AND circuits 86 and 87 to provide a result of an OR operation performed between them, and a buffer circuit (not shown).

Other word lines select units WDU# have similar structures. In word line select unit WDU#0 in the lowermost stage, AND circuit 87 receives ground voltage GND ("L" level) as an input signal to be supplied from the preceding word line select unit.

The word line select unit corresponding to word line WLm−1 in the uppermost stage includes AND circuits 86 and 87, OR circuit 88, an inverter 68 forming a buffer circuit, and reset circuit 60. Each of input nodes of AND circuit 86 receives an inverted signal of power supply voltage VCC ("H" level). AND circuit 87 receives, on one of its input nodes, an inverted signal of the output signal of logical unit 85 in the preceding word line select unit, and also receives, on the other input node, shift control signal S also supplied to preceding word line select unit WDU#. OR circuit 88 receives the output signals of AND circuits 86 and 87, and provides the result of OR operation performed between them to inverter 68 and reset portion 60. Inverter 61 included in reset portion 60 and inverter 68 form a buffer circuit, which amplifies a signal supplied from OR circuit 88, and outputs the amplified signal. Although not illustrated in the figures, other word line select units likewise include inverters 68 and reset portions 60 forming the buffer circuits.

Word line select unit WDU# according to the first modification of the first embodiment operates as follows.

Word line select unit WDU# executes access (selecting operation) to corresponding word line WL based on input of predecode signals XA, XB and XC from predecode circuit 15, and also executes a shift operation of shifting the operation of selecting corresponding word line WL based on shift control signal S supplied from corresponding latch portion LTU of shift information latch circuit 6.

More specifically, when the word line corresponding to word line select unit WDU# is to be activated based on the input of predecode signals XA, XB and XC, word line select unit WDU# determines, based on shift control signal S, whether corresponding word line WL is to be activated, and word line WL is to be selected by driving word line select unit WDU# in the following stage or not. When logical unit 85 issues a signal at "L" level based on predecode signals XA, XB and XC, the access to selected word line WL is executed if corresponding shift control signal S is at "L" level. If corresponding shift control signal S is at "H" level, both the signal of logical unit 85 and shift control signal S are sent to the following word line select unit so that access to word line WL corresponding to the word line select unit in the following stage is executed. Thus, the select operation shifted upward by one stage is executed.

Therefore, the shift operation is executed without accessing the faulty word line based on the shift control signal, similarly to word line select unit WDU of the first embodiment, and thereby, the word line corresponding to the faulty memory cell row can be repaired with the redundant word line, i.e., word line WLm−1 in this modification.

Second Modification of the First Embodiment

The first embodiment and the first modification have been described in connection with a manner, in which the redundant memory cell row is used to execute the operation of shifting one stage, i.e., one memory cell row for repairing a faulty memory cell row. In practice, a fault often occurs in a memory cell row neighboring to the faulty memory cell. Therefore, repairing with the redundant memory cell row can be more efficiently if access to such a neighboring memory cell row is likewise prevented.

The second modification of the first embodiment will now be described in connection with a manner, in which the shift operation is executed for each of word line groups.

Figure 16:
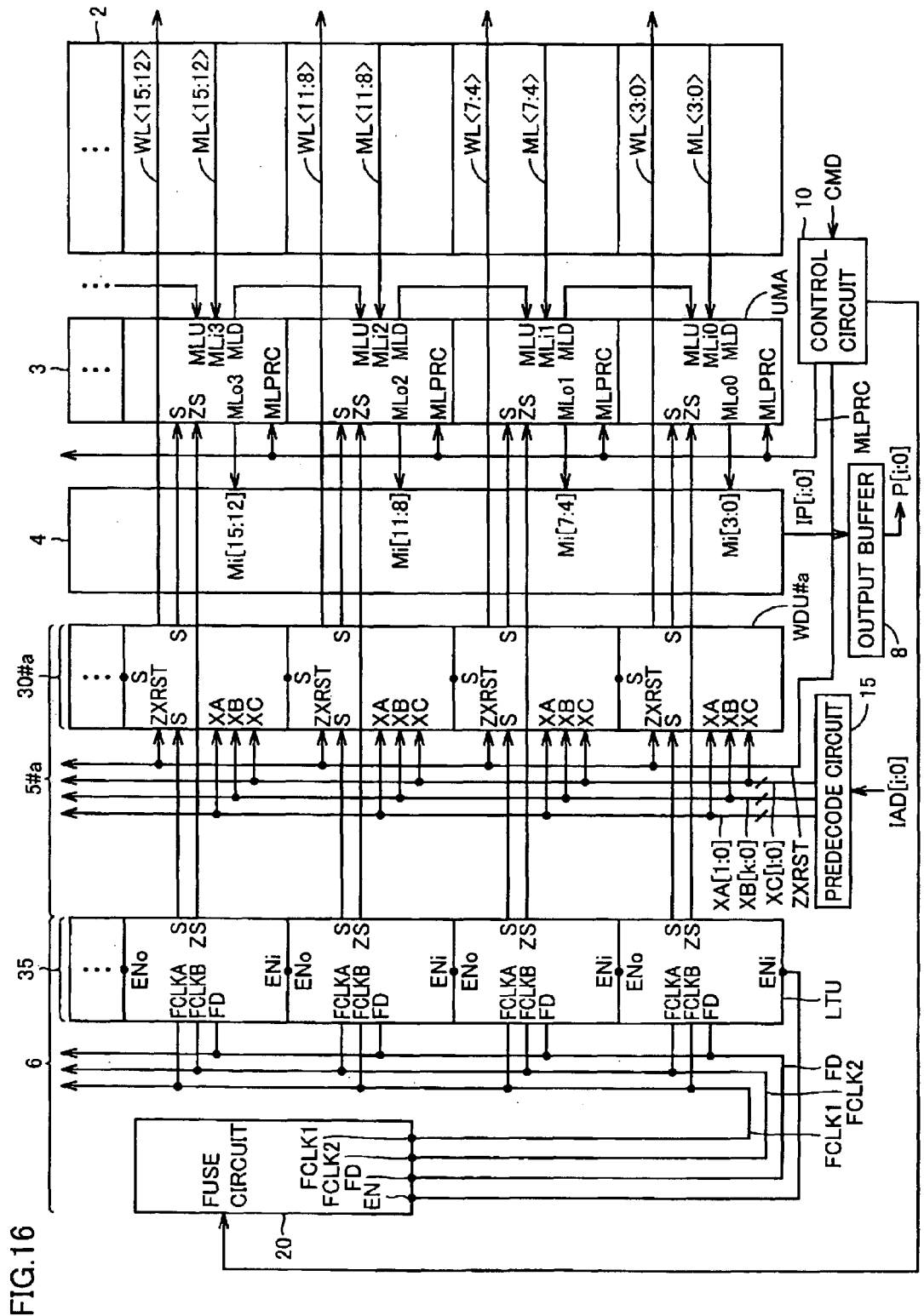
FIG. 16 is a schematic block diagram specifically showing a second modification of the first embodiment of the invention.

Referring to FIG. 16, a structure primarily differs from that in the block diagram of FIG. 14 in that a row decoder 5#a is substituted for row decoder 5#. In this modification, four memory cell rows form one word line group, which is shifted at a time as described below. Respective circuits are modified corresponding to such shifting.

Memory array 2 includes line sets or groups each formed of four word lines WL or four match lines ML. For example, word lines WL0–WL3 form one word line group, and four match lines ML0–ML3 form one match line group. Other line groups are formed similarly.

In shift information latch circuit 6, latch portion LTU is provided corresponding to each word line group.

In match line amplifier 3, match amplifier unit UMA is provided corresponding to each word line group for receiving, in a data retrieving operation, a match signal from four match lines ML forming one group, and providing four bits of an amplified match signal to priority encoder 4 at a time. In the data retrieving operation, priority encoder 4 receives four bits of the amplified match signals from match line amplifier 3 at a time, and produces matched address IP[i:0].

Row decoder 5#a differs from row decoder 5# in that a word line select circuit 30#a is substituted for word line select circuit 30. In this example, predecode circuit 15 issues predecode signals XA[1:0], XB[k:0] and XC[0:1] to word line select circuit 30. Structures other than the above are the same as those already described, and therefore, description thereof is not repeated.

Word line select circuit 30#a includes a plurality of word line select units WDU#a provided corresponding to respective memory cell row groups each including four memory cell rows.

Figure 17:
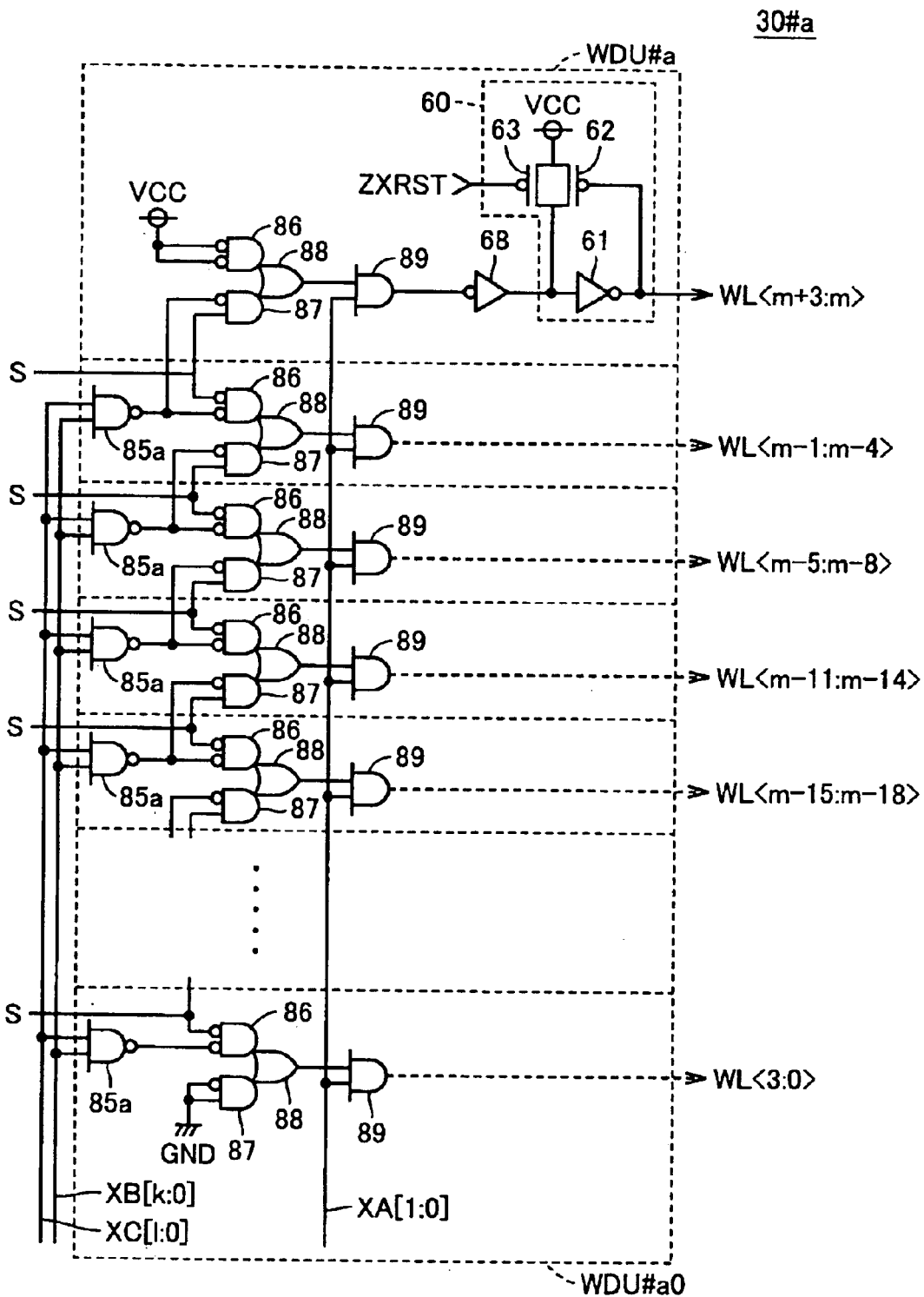
FIG. 17 shows a circuit structure of a plurality of word line select units according to the second modification of the first embodiment of the invention.

Referring to FIG. 17, word line sets (WL<3:0>–WL<m+3:m>) each formed of, e.g., four word lines are provided for the plurality of word line select units WDU#a according to the second modification of the first embodiment of the invention. The plurality of word line select units WDU#a correspond to word line sets (WL<3:0>–WL<m+3:m>), respectively. Word line select units WDU#a generally represent the plurality of word line select units. Word lines WL<m+3:m> are provided as one redundant word line group formed of four redundant word lines. In this example, "P<x:o>" represents P0–Px.

Except for the word line select unit corresponding to word line WLm−1 in the uppermost stage, all the word line select units WDU#a have the same structure.

By way of example, word line select unit WDU#a corresponding to word lines WL<m−1:m−4> will now be described.

Word line select unit WDU#a includes a logical unit 85a, which receives predecode signals XB and XC to issue a signal at "L" level based on a predetermined combination of the received signal, AND circuit 86, which receives an inverted signal of shift control signal S and an inverted signal applied from logical unit 85a, and provides a result of an AND operation performed between them, AND circuit 87, which receives an inverted signal of the output signal of logical unit 85a of the word line select unit in a preceding stage corresponding to word lines WL<m−5:m−8> as well as a shift control signal supplied to the word line select unit in the preceding stage, and provides a result of an AND operation performed between them, OR circuit 88 receiving outputs of AND circuits 86 and 87 to provide a result of an OR operation performed between them, a logical unit 89, which receives the output signal of OR circuit 88 and a predecode signal XA[1:0] to issue a signal at "L" level based on a predetermined combination thereof, and a buffer circuit (not shown).

Although not shown in the figure, logical unit 89 is electrically coupled to the corresponding four word lines via the buffer circuit. In this example, logical unit 89 is electrically coupled to each of four word lines WL<m−1:m−4>.

Other word lines select units WDU#a have similar structures. In word line select unit WDU#a0 in the lowermost stage, AND circuit 87 receives ground voltage GND ("L" level) as an input signal to be supplied from the preceding word line select unit.

The word line select unit corresponding to word line WLm−1 in the uppermost stage includes AND circuits 86 and 87, OR circuit 88, logical unit 89, inverter 68 forming a buffer circuit, and reset circuit 60. Each of input nodes of AND circuit 86 receives an inverted signal of power supply voltage VCC ("H" level). AND circuit 87 receives, on one of its input nodes, an inverted signal of the output signal of logical unit 85a in the preceding word line select unit, and also receives, on the other input node, shift control signal S also supplied to preceding word line select unit WDU#a. OR circuit 88 receives the output signals of AND circuits 86 and 87, and provides the result of OR operation performed between them to inverter 68 and reset portion 60. Inverter 61 included in reset portion 60 and inverter 68 form a buffer circuit, which amplifies a signal supplied from OR circuit 88, and outputs the amplified signal. Although not illustrated in the figures, other word line select units likewise include inverter 68 and reset portion 60 forming the buffer circuits.

Word line select unit WDU#a according to the second modification of the first embodiment operates as follows.

Word line select unit WDU#a executes access (selecting operation) to the corresponding word line group based on input of predecode signals XB and XC from predecode circuit 15, and also executes a shift operation of shifting the operation of selecting the corresponding word line group based on shift control signal S supplied from corresponding latch portion LTU of shift information latch circuit 6.

More specifically, the word line group corresponding to word line select unit WDU#a is activated based on the input of predecode signals XB and XC. When the word line group corresponding to word line select unit WDU#a is to be activated based on the input of predecode signals XB and XC, word line select unit WDU#a determines, based on shift control signal S, whether corresponding word line group is to be selected, and word line group is to be selected by driving word line select unit WDU#a in the following stage or not.

When logical unit 85a issues a signal at "L" level based on predecode signals XB and XC, the access to the selected word line group is executed if corresponding shift control signal S is at "L" level. If corresponding shift control signal S is at "H" level, both the signal of logical unit 85a and shift control signal S are sent to the word line select unit in the following stage so that access to the word line group corresponding to the word line select unit in the following stage is executed. Thus, the select operation shifted upward by one stage is executed.

In the operation of selecting the word line group, an operation of selecting the word line in the group is executed. More specifically, in accordance with input of the output signal of OR circuit 88, one word line WL is selected from four word lines WL based on two bits of predecode signal XA[1:0] supplied to logical unit 89. For example, the operation can be set or configured as follows. When predecode signal XA includes the highest and subsequent bits of "11", the word line in the highest or uppermost stage is selected from the selected word line group. When predecode signal XA includes the highest and subsequent bits of "00", the word line in the lowermost stage is selected from the selected word line group.

Figure 18:
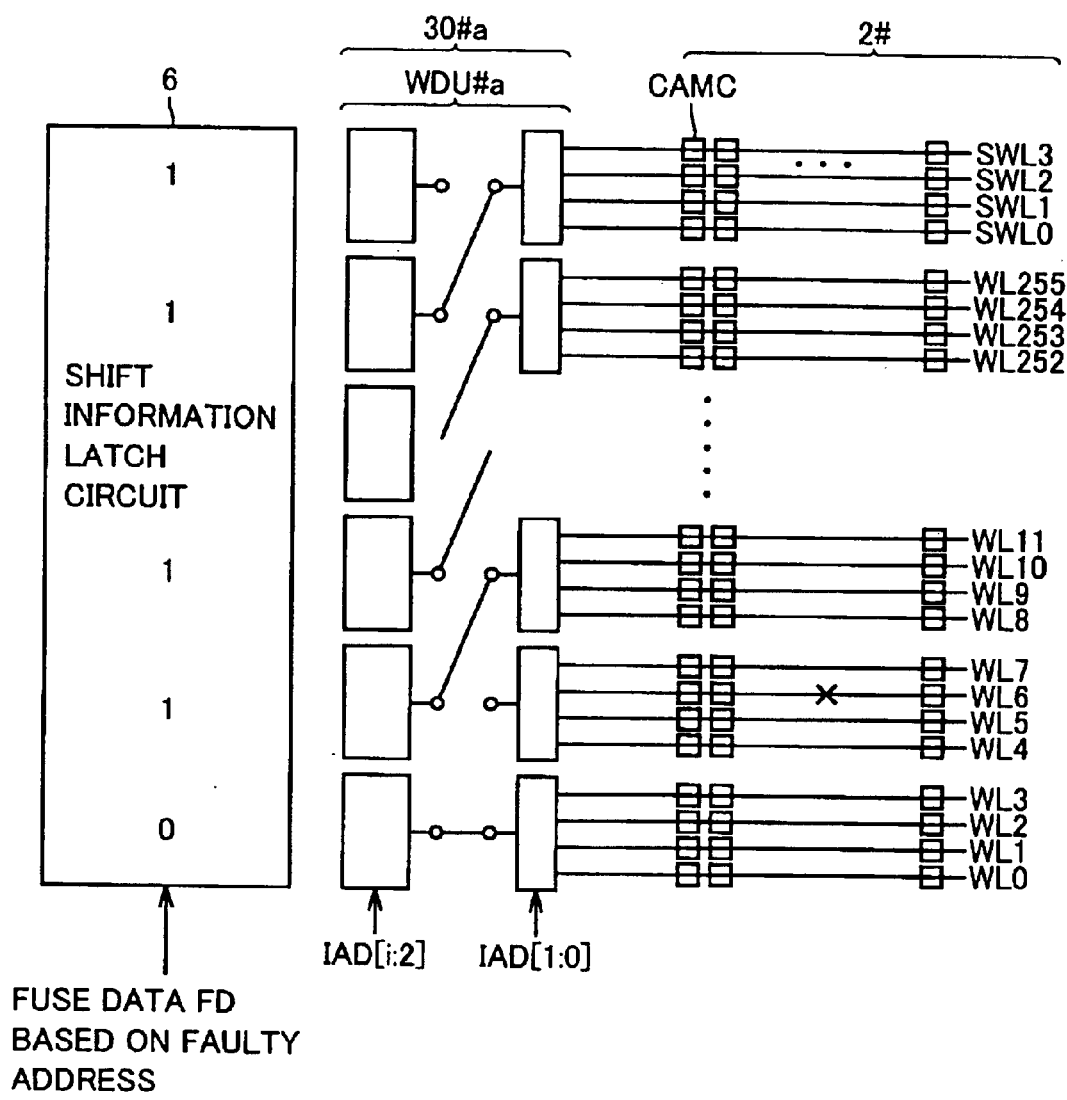
FIG. 18 schematically and conceptually shows a shift operation executed by a row decoder based on fuse data latched by a shift information latch circuit.

Referring to FIG. 18, description will now be given on the shift operation, which is performed by row decoder 5#a based on fuse data FD latched by shift information latch circuit 6. It is assumed that word line WL6 is faulty, and fuse circuit 20 has stored the faulty address corresponding to the word line group including word line WL6.

Similarly to the manner already described, fuse data FD is supplied to first and following latch portions LTU of shift information latch circuit 6 in ascending order. Thereby, each latch portion LTU sets shift control signals S and ZS in accordance with supplied fuse data FD, and sends them to corresponding word line select unit WDU#a of row decoder 5#a.

In this example, latch portion LTU in the first stage receives fuse data FD ("0"), and thereby, sets shift control signals S and ZS to "L" and "H" levels, respectively. Latch portions LTU in the second and following stages receive fuse data FD ("1"), and thereby, each set shift control signals S and ZS to "H" and "L" levels, respectively.

Therefore, first word line select unit WDU#a of row decoder 5#a selects the corresponding word line group based on shift control signal S ("L" level). Second and following word line select units WDU#a select the corresponding word line groups of the following word line select units based on shift control signal S ("H" level), respectively.

In the structure according to the second modification of the first embodiment of the invention, the shift operation for one word line group is executed based on the shift control signal. Thus, by using the redundant word line group, it is possible to repair one word line group when the memory cell rows corresponding to this word line group include a faulty memory cell row.

In the data retrieving operation, the shift operation is executed in a similar manner. More specifically, in a manner similar to that already described with reference to FIG. 11, the shift operation is executed to shift the signals transmitted to four match lines ML at a time, instead of shifting the signals one by one, based on shift control signals S and ZS. By executing the shift operation as described above, the access in the data read and write operations can be performed such that the shift operation shifted to an address higher by one stage in row decoder 5#a is re-shifted to the address lower by one stage during the data retrieving, and thereby the signal indicating the original logical address is transmitted.

The match signal shifted by this shift operation is supplied, as the match signal of four bits, to priority encoder 4 in FIG. 12, and appropriate address IP[i:0] corresponding to the memory cell row, which is matched during the data retrieving, can be produced in a similar manner.

The modification has been described in connection with the structure, in which four memory cell rows are handled as one set when executing the shift operation. This is not restrictive, and memory cells of n larger than one in number can be handled as one set for executing the shift operation in a similar manner.

Accordingly, the structure of the second modification of the first embodiment can perform efficient repairing with the redundant memory cell row group. As described above, word line select units WDU#a each executing the shift operation for the group of four word lines are provided so that the numbers of parts and lines can be reduced, as compared with structures employing word line select units WDU or WDU# each executing the shift operation for one word line WL. Various circuits have been miniaturized, and provision of the word line select units each executing the shift operation for the multiple word lines can improve a layout efficiency.

Third Modification of the First Embodiment

The first embodiment of the invention has been described in connection with a redundant repair structure repairing a faulty memory cell row.

A third modification of the first embodiment of the invention will now be described in connection with a CAM executing the comparing or match-determining operation, and particularly in connection with a structure for reducing power consumption in the data retrieving operation.

Figure 19:
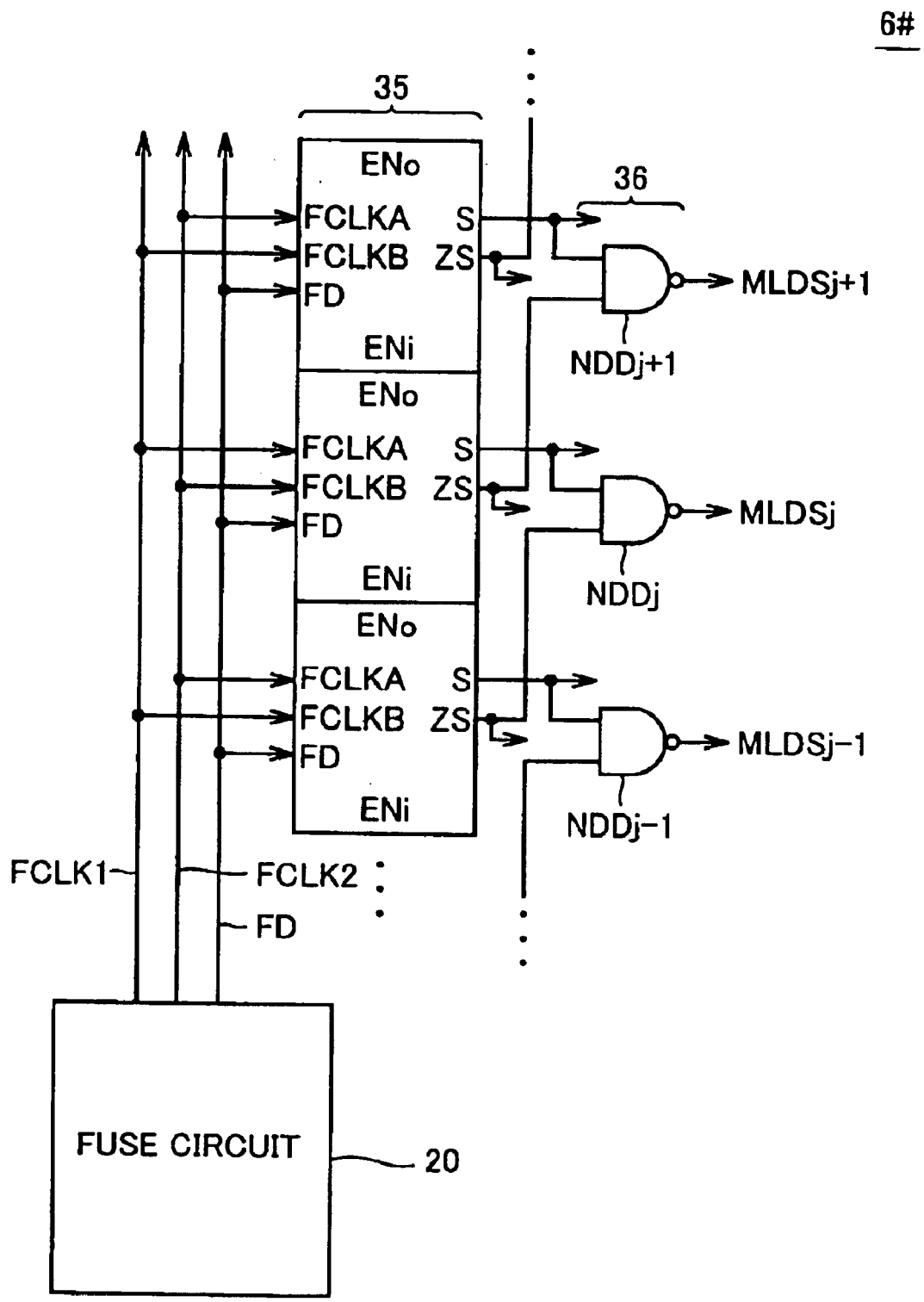
FIG. 19 is a schematic block diagram of a shift information latch circuit according to a modification of the third embodiment of the invention.

Referring to FIG. 19, a shift information latch circuit 6# according to the third modification of the first embodiment of the invention differs from shift information latch circuit 6 of the first embodiment, which is already described with reference to FIG. 2, in that an NAND circuit group 36 is further employed.

NAND circuit group 36 includes a plurality of NAND circuits NDD arranged corresponding to the plurality of latch portions LTU, respectively. FIG. 19 shows latch portions LTU in the (j−1)th, jth and (j+1)th positions as well as NAND circuits NDDj−1–NDDj+1 corresponding to the respective latch portions LTU. NAND circuits NDD generally represent a plurality of NAND circuits.

NAND circuit NDD receives shift control signal S provided from corresponding latch portion LTU and shift control signal ZS produced from latch portion LTU corresponding to the lower address (preceding stage), and provides a result of the NAND operation conducted between them as a control signal MLDS. FIG. 19 shows control signals MLDSj−1–MLDSj+1 provided from NAND circuits NDDj−1–NDDj+1, respectively. It is assumed that shift control signal ZS provided to NAND circuit NDD0 corresponding to the lowest address is always at the "H" level.

For example, control signal MLDSj is set to the "L" level only when NAND circuit NDDj receives shift control signal S at the "H" level and NAND circuit NDDj−1 receives shift control signal ZS at the "H" level. Otherwise, control signal MLDSj is set to the "H" level. In other words, control signal MLDSj is set to the "L" level only when jth latch portion LTU is supplied with fuse data FD of "1", and (j−1)th latch portion LTU is supplied with fuse data FD of "0".

Figure 20:
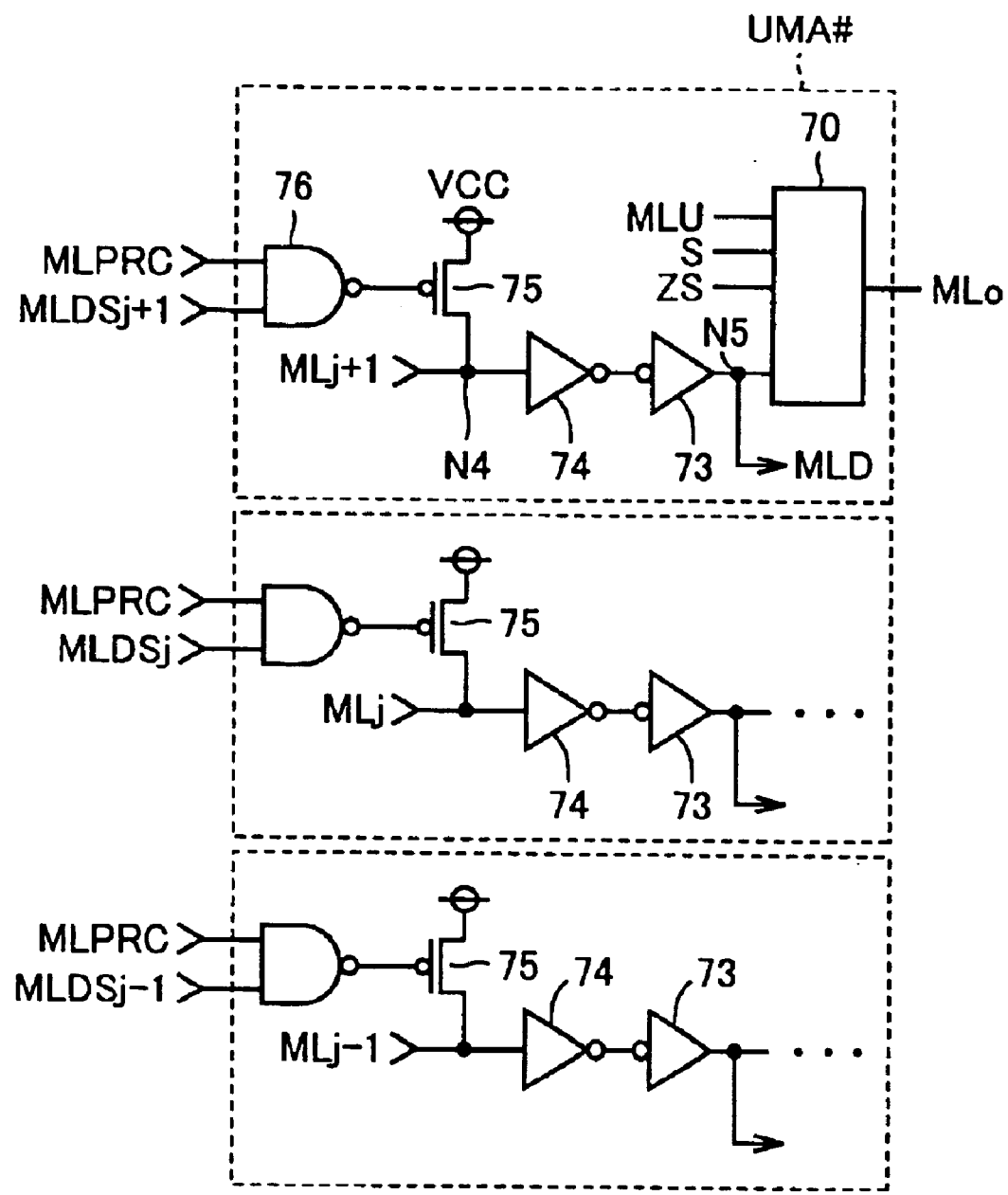
FIG. 20 is a schematic block diagram showing match amplifier units according to the modification of the third embodiment of the invention.

Referring to FIG. 20, a match amplifier unit UMA# according to the third modification of the first embodiment of the invention differs from match amplifier unit UMA of the first embodiment already described with reference to FIG. 11 in that an NAND circuit 76 is further employed. FIG. 20 representatively shows match amplifier units UMA# in the (j−1)th, jth and (j+1)th positions.

In (j+1)th match amplifier unit UMA#, NAND circuit 76 provides a result of the NAND operation, which is conducted between control signals MLPRC and MLDSj+1 applied thereto, to the gate of transistor 75.

Other match amplifier units UMA# have similar structures, and detailed description thereof is not repeated.

Therefore, when control signal MLDSj+1 is set to the "H" level, transistor 75 is turned on in response to the input of control signal MLPRC. However, transistor 75 is always on when control signal MLDSj+1 is at the "L" level.

In contrast to the foregoing example, therefore, the foregoing precharging operation is not executed on the corresponding match line ML when control signal MLDSj is the "L" level.

The first embodiment already described employs the structure, in which all the match lines ML are precharged in response to the input of control signal MLPRC ("H" level) when the precharge operation is performed prior to the data retrieving operation.

However, it is not necessary to execute the precharge operation on match line ML corresponding to the faulty memory cell row. Conversely, if the precharge operation is executed when corresponding match line ML is faulty, an abnormal leak current may flow, which may cause a defect in a device.

According to the structure of this embodiment, NAND circuit group 36 is employed so that control signal MLDS is set to the "L" level only for NAND circuit NDD corresponding to the faulty memory cell row. In match amplifier unit UMA#, therefore, the precharge operation is not executed on match line ML corresponding to the faulty memory cell row.

Thereby, the precharge operation is executed on only valid match lines ML so that power consumption of the CAM device can be reduced.

Second Embodiment

In a second embodiment, description will now be given on a structure of a memory cell CAMC# replaceable with memory cell CAMC.

Figure 21:
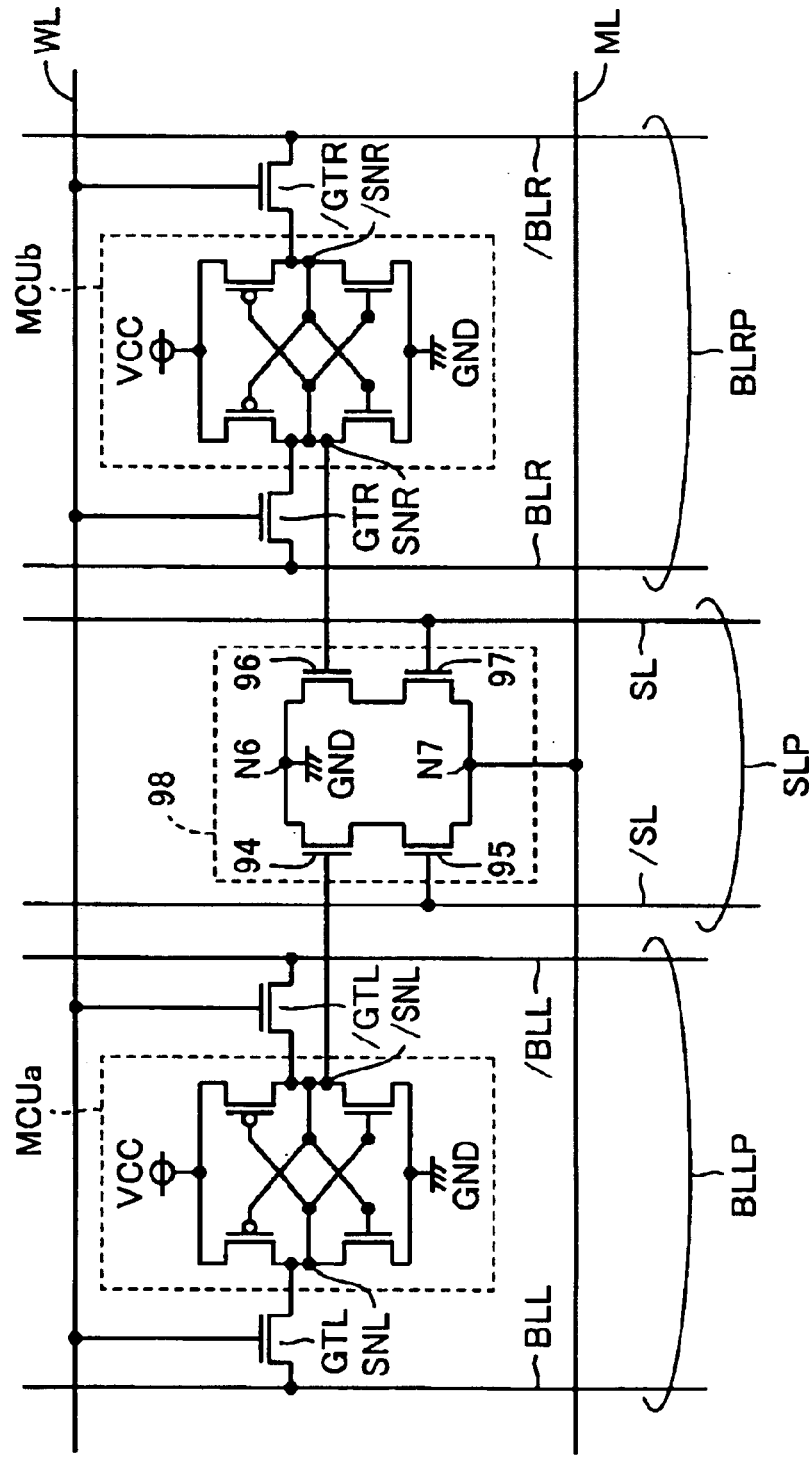
FIG. 21 shows a structure of a memory cell according to a second embodiment of the invention.

Referring to FIG. 21, memory cell CAMC# according to the second embodiment of the invention includes two memory cell units MCUa and MCUb, comparing portion 98, and gate transistors GTL, /GTL, GTR and /GTR. Memory cell CAMC# is a so-called TCAM cell.

Memory cell unit MCUa is provided corresponding to a bit line pair BLLP. Memory cell unit MCUb is provided corresponding to a bit line pair BLRP. Memory cell units MCUa and MCUb have circuit structures equivalent to that of memory cell unit MCU in the first embodiment already described, and detailed description thereof is not repeated. As already described, each of memory cell units MCUa and MCUb functions as a flip-flop circuit, which sets two sense nodes to different voltage levels in accordance with the data to be stored, respectively.

Gate transistor GTL is arranged between a sense node SNL of memory cell unit MCUa and a bit line BLL of bit line pair BLLP, and has a gate electrically coupled to word line WL. Gate transistor /GTL is arranged between a sense node /SNL of memory cell unit MCUa and a complementary bit line /BLL, and has a gate electrically coupled to word line WL. Gate transistor GTR is arranged between a sense node SNR of memory cell unit MCUb and a bit line BLR of bit line pair BLRP, and has a gate electrically coupled to word line WL. Gate transistor /GTR is arranged between a sense node /SNR and a complementary bit line /BLR of bit line pair BLRP, and has a gate electrically coupled to word line WL.

Comparing portion 98 receives a pair of data, which correspond to the voltage levels on sense node /SNL of memory cell unit MCUa and sense node SNR of memory cell unit MCUb, respectively, as well as input data transmitted to search line pair SLP, and transmits a signal based on a result of the comparison between the pair of data and input data to match line ML.

Comparing portion 98 includes transistors 94–97. Transistors 94–97 are, e.g., N-channel MOS transistors. Transistors 94 and 95 are connected in series between a node N6 supplied with ground voltage GND and a node N7, and have gates electrically connected to sense node /SNL and search line /SL, respectively. Transistors 96 and 97 are connected in series between node N6 supplied with ground voltage GND and node N7, and have gates electrically connected to sense node SNR and search line SL, respectively. Node N7 is electrically coupled to match line ML. Match line ML is at the voltage level of power supply voltage VCC attained by the precharging, which is performed before the data retrieving operation as described above.

Memory cells CAM and TCAM differ from each other in a manner of storage (i.e., binary storage and ternary storage). Memory cell TCAM selectively stores three states of "0", "1" and "X" (don't care).

In the following description, it is assumed that memory cell CAMC# has stored data of "0". In this example, the state of storing data of "0" corresponds the state, in which sense nodes /SNL and sense node SNR are at the "L" and "H" levels, respectively.

The following description is given on the case where the data retrieving operation is performed, and search line pair SLP is supplied with the data of "0". In this example, it is also assumed that search line SL is set to the "L" level, and complementary search line /SL is set to the "H" level.

In this case, transistors 96 and 95 are turned on in comparing portion 98, but match line ML is not electrically coupled to ground voltage GND so that match line ML maintains the voltage level of power supply voltage VCC. In this case, it is assumed that the input data and the retrieved data are hit, as already described.

When search line pair SLP is supplied with data of "1", the operation is performed as follows. In this example, it is assumed that search line SL is set to the "H" level, and complementary search line /SL is set to the "L" level.

In this case, transistors 96 and 97 are turned on in comparing portion 98. Thereby, match line ML is electrically coupled to node N6. Thus, the voltage level of match line ML is pulled down by ground voltage GND. In this case, the input data and the retrieved data are mishit, as already described.

Accordingly, the retrieving operation can be performed in memory cell CAMC# similarly to CAM memory cell CAMC.

In addition to the above, memory cell CAMC# stores further another state of "X (don't care)". This storage state corresponds to the case where both sense nodes /SNL and SNR are set to the "L" level.

When the data retrieving operation is performed, both transistors 94 and 96 of comparing portion 98 are off because both sense nodes /SNL and SNR are at the "L" level. When search line pair SLP is supplied with data of "0" or "1", ground voltage GND is not electrically coupled to match line ML in either case, and the result of comparison always represents "hit". Accordingly, memory cell CAMC# can store the state of "X" always causing "hit".

The retrieval data forming the retrieval information is formed of a combination of ternary data bits in the above structure. This is particularly effective, e.g., for the processing performed on IP (Internet Protocol) packets in the network system. For the sake of simplicity, it is assumed that a destination address of a packet is represented by four bits. It is also assumed that when a destination address of a certain packet is "1XXX", in which a leading bit is "1", but the other bits can take any values, predetermined processing is to be effected on this packet. When the packet reaches the system, it is assumed a CAM or TCAM is used for retrieving the destination address and determining whether it matches with the address of "1XXX" or not.

In this case, it is necessary to store the data of "1XXX" in a CAM or TCAM. If a CAM of an ordinary binary-storage type is used, it is necessary to store eight states, i.e., "1000", "1001", "1011", "1100", "1101", "1110" and "1111".

Therefore, eight words are consumed for retrieving the destination address of the packet.

Conversely, the TCAM can store the state of "X", and therefore is required to store only one word of "1XXX". If the number of bits of the destination address further increases, the difference in number of words to be used further increases. In the case where the TCAM is used, it is possible to store various data with a small number of words. In practice, the IP packet includes, in addition to the destination address, various kinds of information such as an IP address of the sender, information representing a communication quality and a version number of the IP protocol. Therefore, the TCAM is very useful when retrieving processing is effected on these kinds of information.

The TCAM memory cell and the CAM memory cell are different from each other only in cell structure, and the retrieving operation with match line ML is performed in the same manner. Therefore, the TCAM memory cell can be applied to the memory cell array of the first embodiment. In this case, a redundant repair structure similar to that shown in FIG. 2 can be used.

Accordingly, by using the TCAM memory cells of the second embodiment instead of the CAM memory cells, it is possible to provide further useful content addressable memories.

Modification of the Second Embodiment

A modification of the second embodiment will now be described with reference to a structure of another TCAM memory cell.

Figure 22:
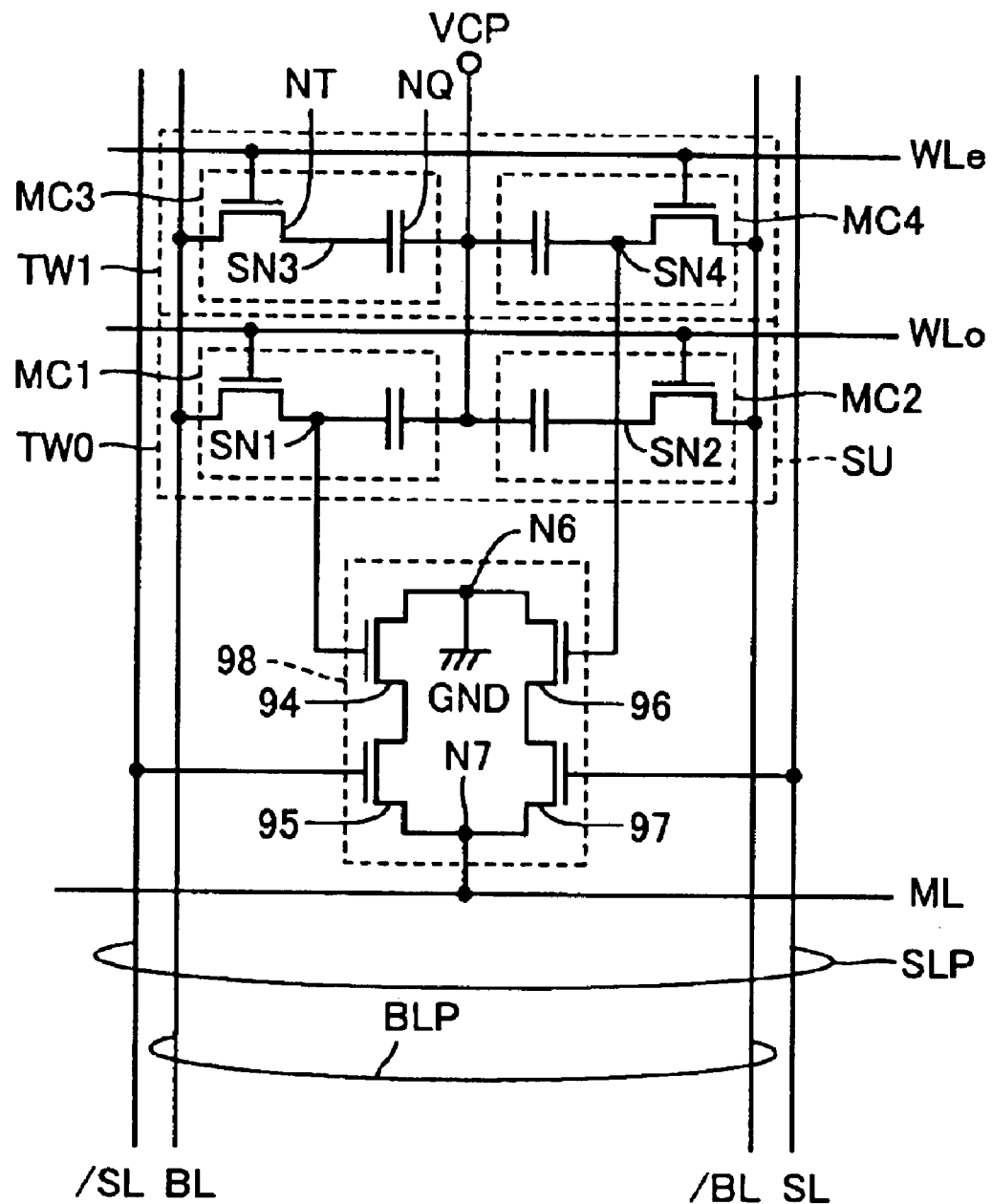
FIG. 22 shows a circuit structure of a memory cell according to a modification of the second embodiment of the invention.

Referring to FIG. 22, a memory cell CAMCa according to a modification of a second embodiment includes a storage portion SU storing one bit of data, and comparing portion 98 comparing data stored in storage portion SU with retrieved data bits transmitted via search lines SL and /SL.

Storage portion SU includes a twin-cell TW0, which stores complementary write data transmitted to bit lines BL and /BL in response to a signal on a word line (selected line) WLe in the data write operation, and a twin-cell TW1, which stores complementary data transmitted to bit lines BL and /BL in response to a signal potential on a word line WLo in the data write operation. Data transmitted by bit lines BL and /BL are always complementary to each other.

Likewise, search lines SL and /SL always transfer complementary data corresponding to the retrieval data.

One bit of the storage data of memory cell CAMCa according to the modification of the second embodiment is represented by two complementary storage data of twin-cells TW0 and TW1.

Twin-cell TW0 includes a dynamic cell MC1 arranged corresponding to a crossing between word line WLe and bit line BL, and a dynamic cell MC2 arranged corresponding to a crossing between word line WLe and bit line /BL. Twin-cell TW1 includes a dynamic cell MC3 arranged corresponding to a crossing between word line WLo and bit line BL, and a dynamic cell MC4 arranged corresponding to a crossing between word line WLo and bit line /BL.

Each of dynamic cells MC1–MC4 includes a capacitor NQ storing data in the form of electric charges, and an access transistor NT coupling capacitor NQ to corresponding bit line BL or /BL in response to a signal on the corresponding word line. These dynamic cells MC1–MC4 have structures similar to that of a DRAM (Dynamic Random Access Memory) of one-transistor/one-capacitor type.

A cell plate voltage VCP is commonly supplied to one of electrodes of capacitor NQ in each of dynamic cells MC1–MC4. The other electrodes of capacitors NQ of dynamic cells MC1–MC4 are used as storage nodes SN1–SN4 storing electric charges corresponding to the storage data, respectively.

Therefore, this storage portion SU is formed of the dynamic cells of four bits. Twin-cells TW0 and TW1 store complementary data, respectively. These dynamic cells of four bits store the data corresponding to the retrieval data of one bit.

Comparing portion 98 has substantially the same structure as that in the second embodiment already described except for that transistors 94 and 96 are electrically coupled to storage nodes SN1 and SN4, respectively.

In memory cell CAMCa according to the modification of the second embodiment, the data retrieving operation can be executed similarly to memory cell CAMC#.

Dynamic cells MC1 and MC2 included in twin-cell TW0 have storage nodes SN1 and SN2 storing the complementary data as already described, respectively. Likewise, dynamic cells MC3 and MC4 included in twin-cell TW1 have storage nodes SN3 and SN4 storing the complementary data, respectively.

It is now assumed that memory cell CAMCa has stored data of "0". In this example, it is assumed that when data of "0" is stored, sense nodes SN1 and SN4 are at the "L" and "H" levels, respectively. The data write operation is similar to that of the normal DRAM cell, and description thereof is not repeated.

It is now assumed that the data retrieving operation is performed, and search line pair SLP is supplied with data of "0". In this example, search line SL is set to the "L" level, and complementary search line /SL is set to the "H" level.

In this case, transistors 96 and 95 in comparing portion 98 are turned on. However, match line ML is not electrically coupled to ground voltage GND, and match line ML maintains the voltage level of power supply voltage VCC. As already described above, this state represents the "hit" of the input data and the retrieved data.

Then, it is assumed that search line pair SLP is supplied with data of "1". In this state, it is assumed that search line SL is set to the "H" level, and complementary search line /SL is set to the "L" level.

In this case, transistors 96 and 97 are turned on in comparing portion 98. Thereby, match line ML is electrically coupled to node N6. Thus, the voltage level of match line ML is pulled down by ground voltage GND. As already described, this state represents the "mismatch" between the input data and the retrieved data.

In addition to the above, memory cell CAMCa stores further another state of "X" (don't care). This storage state corresponds to the case where both sense nodes SN1 and SN4 are set to the "L" level.

When the data retrieving operation is executed, transistors 94 and 96 in comparing portion 98 are both off because both sense nodes SN1 and SN4 are at the "L" level. Therefore, in either of the cases where search line pair SLP is supplied with "0", and is supplied with "1", ground voltage GND is not electrically coupled to match line ML, and a result of the comparison always represents the "hit". In this case, the state of "X" always representing the "hit" can be stored.

Accordingly, the data retrieving operation can be executed in memory cell CAMCa similarly to CAM memory cell CAMC#.

Memory cell CAMCa according to the modification of the second embodiment employs capacitors NQ, and has a larger capacity value than the structure employing the SRAM cell so that the resistance to software errors can be improved, as compared with TCAM memory cell CAMC# using the SRAM cell.

Memory cell CAMCa according to the modification of the second embodiment can reduce the number of parts and the circuit area, as compared with TCAM memory cell CAMC#.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A content addressable memory for making a comparison between input information and retrieval information, comprising:
    a memory array including a plurality of memory cell rows storing said retrieval information, and a redundant memory cell row repairing a faulty memory cell row;
    a first shift circuit shifting; if necessary, each of at least one memory cell row to be accessed in a first direction during data reading and data writing;
    a second shift circuit shifting each of said at least one memory cell row shifted in said first direction by said first shift circuit in a second direction opposite to said first direction in data retrieving;
    an address producing circuit producing an intended address based on information transmitted from each of said memory cell rows through said second shift circuit in said data retrieving;
    a plurality of stages of latch circuits provided corresponding to respective addresses of said plurality of memory cell rows, and each latching a shift signal instructing an operation of shifting the corresponding memory cell row in said first and second shift circuits; and
    a shift signal producing portion producing said shift signal to be latched by each of said latch circuits based on a faulty address of said faulty memory cell row.

2. The content addressable memory according to claim 1, wherein said shift signal producing portion includes:
    a storing portion storing said faulty address of said faulty memory cell row, and
    a control circuit issuing said shift signal to each of said latch circuits corresponding to the address of memory cell row in sequence among said plurality of stages of latch circuits, on the address of said faulty memory cell row stored in said storing portion.

3. The content addressable memory according to claim 2, wherein said control circuit includes:
    an address counter counting said addresses corresponding to said plurality of memory cell rows one by one in ascending order,
    a comparing circuit making comparison between the address provided from said address counter and said faulty address of said faulty memory cell row stored in said storing portion,
    a signal latch portion setting said shift signal in a binary form based on a result of said comparison, and latching said shift signal for outputting to each of said latch circuits, and wherein,
    each of said latch circuits includes an input control portion sequentially receiving said shift signal issued from said signal latch portion in synchronization with counting by said address counter.

4. The content addressable memory according to claim 1, wherein
    said memory array further includes a plurality of match lines provided corresponding to the plurality of memory cell rows, respectively, and each determining whether said input information matches with a portion of said retrieval information stored in the corresponding memory cell row;
    said content addressable memory further comprises:
    a plurality of precharge units provided corresponding to said plurality of match lines for precharging the corresponding match lines to a predetermined voltage level, respectively, and
    a plurality of precharge control portions activating said plurality of precharge units before said data retrieval, respectively;
    first and second logical data instructing and not instructing said shift operation are set based on said shift signal in each of said latch circuits; and
    each of said precharge control portions activates the corresponding precharge unit when said second logical data is set in the latch circuit corresponding to the same memory cell row, and activates the corresponding precharge unit when said first logical data is set in the latch circuit in previous stage of said corresponding latch circuits when said first logical data is set.

5. The content addressable memory according to claim 1, wherein
    said memory array further includes match lines provided corresponding to said memory cell rows including said redundant memory cell row, respectively, and determining whether said input information matches with a portion of said retrieval information stored in each of said memory cell rows;
    each of said memory cell rows including said redundant memory cell row has a plurality of memory cells each storing one bit of data; and
    each of said memory cells has:
    a first cell unit having a first storage node holding first data,
    a second cell unit having a second storage node holding second data, and
    a comparing circuit comparing a pair of data held on said first and second storage nodes with input data forming said input information, and selectively driving the match line corresponding to a result of the comparison.

6. The content addressable memory according to claim 1, wherein
    said first and second shift circuits and said plurality of stages of latch circuits neighbor to one side of said memory array.

7. The content addressable memory according to claim 1, wherein
    said first shift circuit includes a plurality of row select units corresponding to said plurality of memory cell rows during said data reading and writing, respectively, each performing the shifting in said first direction based on said shift signal, and executing the access to the corresponding memory cell rows based on received addresses of said plurality of memory cell rows, respectively.

8. A content addressable memory for making a comparison between input information and retrieval information, comprising:
    a memory array including a plurality of memory cell rows storing said retrieval information, and a plurality of redundant memory cell rows repairing a faulty memory cell row, said plurality of memory cell rows being divided into a plurality of memory cell row groups, each group including a predetermined number of the memory cell rows, corresponding to a part of bits of addresses of said plurality of memory cell rows;

a first shift circuit shifting, if necessary, each of at least one memory cell row group to be accessed in a first direction during data reading and data writing;

a second shift circuit shifting each of said at least one memory cell row group shifted in said first direction by said first shift circuit in a second direction opposite to said first direction in data retrieving;

an address producing circuit producing an intended address based on information transmitted from each of said memory cell row group through said second shift circuit in said data retrieving;

a plurality of stages of latch circuits provided corresponding to respective addresses of said plurality of memory cell row groups, and each latching a shift signal instructing an operation of shifting the corresponding memory cell row group in said first and second shift circuits; and a shift signal producing portion producing said shift signal to be latched by each of said latch circuits based on a faulty address of said faulty memory cell row.

9. The content addressable memory according to claim 8, wherein said first shift circuit includes a plurality of row select units corresponding to said plurality of memory cell row groups during said data reading and writing, respectively, each performing the shifting in said first direction based on said shift signal, and executing the access to the corresponding memory cell rows based on received addresses of said plurality of memory cell rows, respectively, and the one row select unit corresponding to said part of bits of addresses of said plurality of memory cell rows is selected from said plurality of row select units, and one memory cell row included in the memory cell row group corresponding to said selected row select unit is accessed based on the remaining bits of addresses.

10. A content addressable memory for making a comparison between input information and retrieval information, comprising:

a memory array including a plurality of memory cell rows storing said retrieval information, and a redundant memory cell row repairing a faulty memory cell row;

a first shift circuit shifting, if necessary, each of at least one memory cell row to be accessed in a first direction during data reading and data writing;

a second shift circuit shifting each of said at least one of memory cell row shifted in said first direction by said first shift circuit in a second direction opposite to said first direction in data retrieving;

an address producing circuit producing an intended address based on information transmitted from each of said memory cell rows through said second shift circuit in said data retrieving; and a control circuit controlling said first and second shift circuits based on a faulty address of said faulty memory cell row, wherein said memory array further includes match lines provided corresponding to said memory cell rows including the redundant memory cell row, respectively, and determining whether said input information matches with a portion of said retrieval information stored in said respective memory cell rows, each of said memory cell rows including said redundant memory cell row has a plurality of memory cells each storing one bit of storage data, and each of said memory cells includes:

a first cell unit having a first storage node holding first data, a second cell unit having a second storage node holding second data, and a comparing circuit comparing a pair of data held on said first and second storage nodes with input data forming said applied input information, and selectively driving the corresponding match line in accordance with a result of the comparison.

* * * * *

UNITED STATES PATENT AND TRADEMARK OFFICE
CERTIFICATE OF CORRECTION

PATENT NO.    : 6,917,558 B2
DATED         : July 12, 2005
INVENTOR(S)   : Hideto Matsuoka et al.

It is certified that error appears in the above-identified patent and that said Letters Patent is hereby corrected as shown below:

Title page,
Item [56], References Cited, add:
-- FOREIGN PATENT DOCUMENTS
JP            2002-260389A        09/2002 --.

Signed and Sealed this

Seventh Day of February, 2006

JON W. DUDAS
*Director of the United States Patent and Trademark Office*